(12) United States Patent
Fukami et al.

(10) Patent No.: US 8,149,615 B2
(45) Date of Patent: Apr. 3, 2012

(54) MAGNETIC RANDOM ACCESS MEMORY

(75) Inventors: Shunsuke Fukami, Tokyo (JP);
Nobuyuki Ishiwata, Tokyo (JP);
Tetsuhiro Suzuki, Tokyo (JP); Norikazu Ohshima, Tokyo (JP); Kiyokazu Nagahara, Tokyo (JP)

(73) Assignee: NEC Corporation, Tokyo (JP)

( * ) Notice: Subject to any disclaimer, the term of this patent is extended or adjusted under 35 U.S.C. 154(b) by 58 days.

(21) Appl. No.: 12/865,194

(22) PCT Filed: Jan. 9, 2009

(86) PCT No.: PCT/JP2009/050210
§ 371 (c)(1),
(2), (4) Date: Jul. 29, 2010

(87) PCT Pub. No.: WO2009/104428
PCT Pub. Date: Aug. 27, 2009

(65) Prior Publication Data
US 2010/0309712 A1    Dec. 9, 2010

(30) Foreign Application Priority Data
Feb. 19, 2008  (JP) .................. 2008-038066

(51) Int. Cl.
*G11C 11/00* (2006.01)
*G11C 11/14* (2006.01)
*G11C 11/15* (2006.01)

(52) U.S. Cl. .................... 365/158; 365/171; 365/173

(58) Field of Classification Search .............. 365/158, 365/171, 173
See application file for complete search history.

(56) References Cited

U.S. PATENT DOCUMENTS

| 6,865,107 | B2 * | 3/2005 | Anthony et al. | 365/171 |
| 7,042,036 | B2 * | 5/2006 | Chung et al. | 365/158 |
| 7,154,773 | B2 * | 12/2006 | Braun et al. | 365/158 |
| 7,525,862 | B1 * | 4/2009 | Sun et al. | 365/158 |
| 7,626,856 | B2 * | 12/2009 | Ono | 365/158 |
| 7,872,906 | B2 * | 1/2011 | Miura et al. | 365/158 |
| 7,876,595 | B2 * | 1/2011 | Xi et al. | 365/158 |
| 7,929,342 | B2 * | 4/2011 | Numata et al. | 365/158 |

(Continued)

FOREIGN PATENT DOCUMENTS
JP   2005116888 A    4/2005
(Continued)

OTHER PUBLICATIONS
International Search Report for PCT/JP2009/050210 mailed Apr. 7, 2009.
(Continued)

*Primary Examiner* — Trong Phan

(57) ABSTRACT

An MRAM has: a memory cell including a first magnetoresistance element; and a reference cell including a second magnetoresistance element. The first magnetoresistance element has a first magnetization free layer, a first magnetization fixed layer, a second magnetization free layer and a first nonmagnetic layer sandwiched between the first magnetization fixed layer and the second magnetization free layer. The first magnetization free layer has: first and second magnetization fixed regions; and a magnetization free region. The magnetization free region and the second magnetization free layer are magnetically coupled to each other. Whereas, the second magnetoresistance element has: a third magnetization free layer whose magnetization easy axis is parallel to a second direction; a second magnetization fixed layer whose magnetization direction is fixed in a third direction perpendicular to the second direction; and a second nonmagnetic layer sandwiched between the second magnetization fixed layer and the third magnetization free layer.

10 Claims, 16 Drawing Sheets

U.S. PATENT DOCUMENTS

| | | | |
|---|---|---|---|
| 7,933,137 B2 * | 4/2011 | Dimitrov et al. | 365/171 |
| 7,933,146 B2 * | 4/2011 | Dimitrov et al. | 365/171 |
| 7,936,627 B2 * | 5/2011 | Fukami | 365/158 |
| 8,040,724 B2 * | 10/2011 | Suzuki et al. | 365/173 |

FOREIGN PATENT DOCUMENTS

| | | | |
|---|---|---|---|
| JP | 2005150303 A | 6/2005 | |
| JP | 2005191032 A | 7/2005 | |
| JP | 2006073930 A | 3/2006 | |
| JP | 2006270069 A | 10/2006 | |
| JP | 2007103663 A | 4/2007 | |
| JP | 2007142364 A | 6/2007 | |
| JP | 2007258460 A | 10/2007 | |
| JP | 2008147488 A | 8/2008 | |
| JP | 2009054715 A | 3/2009 | |

OTHER PUBLICATIONS

N. Sakimura et al., "MRAM Cell Technology for Over 500MHZ SoC", 2006 Symposiumon VLSI Circuits, Digest of Technical Papers, 2006, pp. 136.

A. Yamaguchi et al , "Real-Space Observation of Current-Driven Domain Wall Motion in Submicron Magnetic Wires", Physical Review Letters, vol. 92, No. 7, Feb. 20, 2004, pp. 077205-1-077205-4.

A. Yamaguchi et al, "Reduction of Threshold Current Density for Current-Driven Domain Wall Motion using Shape Control". Japanese Journal of Applied Physics, vol. 45, No. 5A, 2006, pp. 3850-3853.

D. Ravelosona et al., "Threshold currents to move domain walls in films with perpendicular anisotropy", Applied Physics Letters, vol. 90, 2007, p. 072508-1-3.

A. Thiaville et al., "Micromagnetic understanding of current-driven domain wall motion in patterned nanowires", Europhysics Letters, vol. 69, Mar. 15, 2005, pp. 990-996.

J. Hayakawa et al, "Effect of high annealing temperature on giant tunnel magnetoresistance ratio of CoFeB/MgO/CoFeB magnetic tunnel junctions". Applied Physics Letters, vol. 89, 2006, pp. 232510-1-232510-3.

* cited by examiner

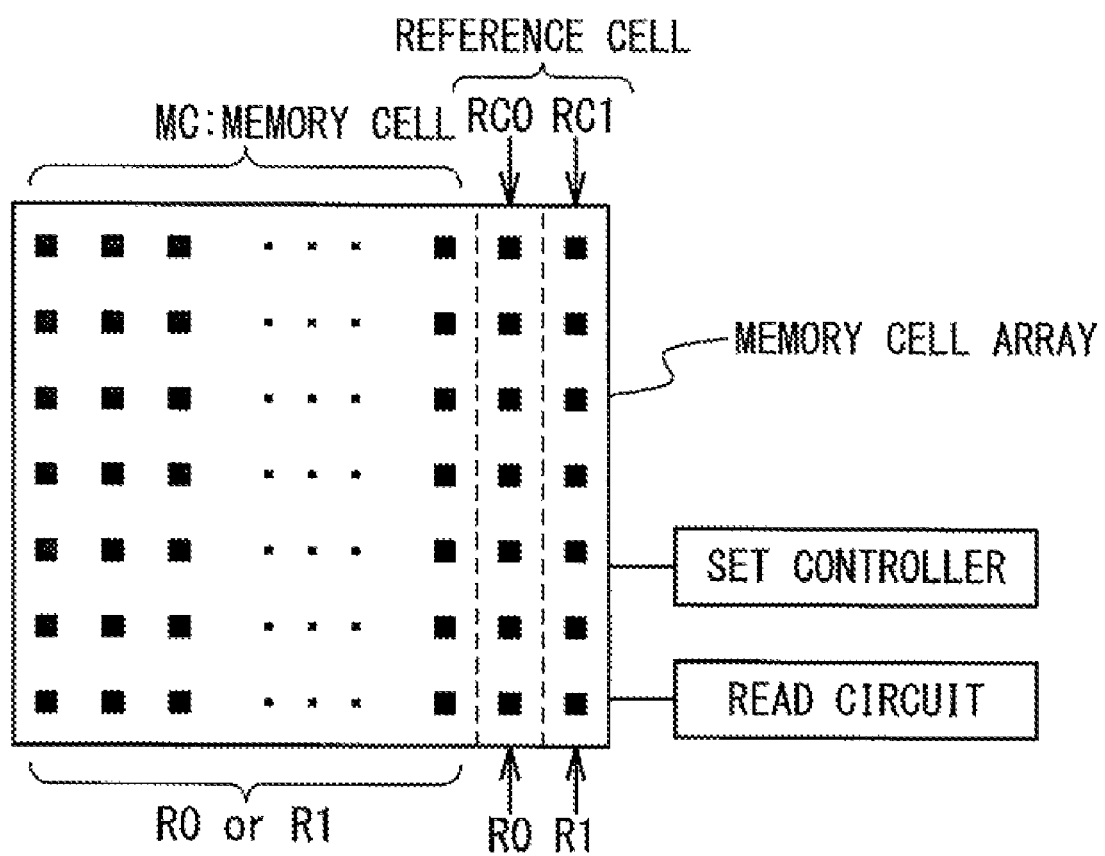

"R0.5"

MAGNETIC RANDOM ACCESS MEMORY

TECHNICAL FIELD

The present invention relates to a magnetic random access memory (MRAM: Magnetic Random Access Memory). In particular, the present invention relates to a domain wall motion type MRAM.

BACKGROUND ART

Magnetic random access memories (MRAMs) are expected to be nonvolatile memories which provide a high speed operation and an infinite number of rewritings, and vigorous developments thereof have been carried out. In an MRAM, a magnetoresistance element is integrated within a memory cell, and a data is stored as an orientation of magnetization of a ferromagnetic layer of the magnetoresistance element. Although several approaches have been proposed as a method of switching the magnetization of the ferromagnetic layer, all of them are common with regard to the use of a current. In putting the MRAM into the practical use, the reduction of the write current is very important, and there is a requirement of the reduction down to 0.5 mA or less, preferably, to 0.2 mA or less, according to 2006 Symposium on VLSI Circuits, Digest of Technical Papers, p. 136.

The most typical one of data writing methods to the MRAM is to dispose an interconnection through which a write current is flown near the magnetoresistance element, and to switch the magnetization direction of the ferromagnetic layer of the magnetoresistance element with a current magnetic field, which is generated by flowing the write current. This method is preferable in attaining the high speed MRAM, because the data write in one nanosecond or less can be achieved in principle. For example, Japanese Patent Publication No. JP-2005-150303A discloses a structure in which the magnetization of the end portion of a magnetization fixed layer is oriented in the film thickness direction, for an MRAM in which the data is written by the current magnetic field.

However, a magnetic field necessary for switching the magnetization of magnetic material which has sufficient thermal stability and resistance against external magnetic field disturbance is typically several ten oersteds, and a large write current around several miliamperes is required to generate such a large magnetic field. When the write current is large, the chip area is inevitably increased and the power consumption necessary for writing is also increased, which causes poor competitiveness as compared with other random access memories. In addition, the size reduction of memory cells causes a further increase in the write current; this is undesirable from the viewpoint of scaling.

In recent years, the following two approaches have been proposed to solving such problems. The first approach is to use a spin transfer magnetization switching. In an MRAM using the spin transfer magnetization switching, a magnetoresistance element of a memory cell is provided with a film stack including a first ferromagnetic layer having a reversible magnetization (often referred to as a magnetization free layer), a second ferromagnetic layer having a fixed magnetization (often, referred to as a magnetization fixed layer), and a tunnel barrier layer disposed between these ferromagnetic layers. In data writing into such an MRAM, the magnetization of the magnetization free layer is reversed by using an interaction caused between localized electrons in the magnetization free layer and spin-polarized conduction electrons when a current is supplied between the magnetization free layer and the magnetization fixed layer. The occurrence of the spin transfer magnetization switching depends on the current density (not on the absolute value of the current), and thus, when the spin transfer magnetization switching is used in the data writing, the write current is decreased as the size of the memory cell is reduced. That is, the spin transfer magnetization switching can be said to be superior in the scaling property. However, a write current is required to flow through the tunnel barrier layer, which has a thin film thickness, in data writing. This causes a problem of rewriting durability and reliability. Also, a current path is commonly used in writing and reading, and this may cause an erroneous writing in reading. As thus described, there are several obstacles in attaining the practical use of the spin transfer magnetization switching, although the spin transfer magnetization switching is superior in the scaling property.

The second approach is to use current-driven domain wall motion. The magnetization reversal using the current-driven domain wall motion allows solving the above-described problems caused by the spin transfer magnetization switching. An MRAM which uses the current-driven domain wall motion is disclosed in, for example, Japanese Patent Publications JP-2005-191032A, JP-2006-73930A and JP-2006-270069A. In the most typical configuration of the MRAM which uses the current-driven domain wall motion, a ferromagnetic layer (often, referred to as a magnetic recording layer) for retaining a data is provided with: a magnetization reversible portion having a reversible magnetization; and two magnetization fixed portions having fixed magnetizations and connected to the respective ends of the magnetization reversible portion. The data is stored as the magnetization of the magnetization reversible portion. The magnetizations of the two magnetization fixed portions are fixed to be substantially anti-parallel to each other. When the magnetizations are thus arranged, a domain wall is introduced into the magnetic recording layer. When a current is supplied in the direction that passes through the domain wall, the domain wall is moved in the direction of conduction electrons, as reported in Physical Review Letters, vol. 92, number 7, p. 077205, (2004), and thus data can be written by supplying a current in the magnetic recording layer. The occurrence of the current-driven domain wall motion also depends on the current density, and thus it can be concluded that the current-driven domain wall motion provides a good scaling property similarly to the spin transfer magnetization switching. In addition, the above-described problems of the spin transfer magnetization switching can be solved in a memory cell of the MRAM that uses the current-driven domain wall motion, since the write current does not flow though the insulating layer, and the write and read current paths are separately provided.

However, an MRAM that uses the current-driven domain wall motion suffers from a problem that the absolute value of the write current is relatively large. According to a large number of reports announced with regard to the observations of the current-driven domain wall motion, the current density of about $1 \times 10^8$ [A/cm2] is necessary for the domain wall motion. In this case, the write current is 1 mA, when the width of the ferromagnetic film in which the domain wall motion occurs is 100 nm and the film thickness is 10 nm, for example. A further reduction in the write current may be achieved by decreasing the width and thickness of the ferromagnetic film; however, a fact is reported in which the current density necessary for the writing is further increased when the film thickness is reduced (for example, refer to Japanese Journal of Applied Physics, vol. 45, No. 5A, pp. 3850-3853, (2006)). Also, the reduction in the width of the ferromagnetic film down to 100 nm or less involves the severe difficulty from the viewpoint of the processing technique.

One promising approach for decreasing the current density is to use a film of perpendicular magnetic anisotropic material that has magnetic anisotropy in the film thickness direction, as the magnetic recording layer (the layer in which the domain wall motion occurs). In the magnetoresistance element that uses the film made of the perpendicular magnetic anisotropic material, the threshold current density in the order of 106 [A/cm2] is observed (for example, refer to Applied Physics Letters, vol. 90, p. 072508, (2007)).

However, the use of the film made of perpendicular magnetic anisotropic material in the magnetic recording layer makes it difficult to increase the magnetoresistance ratio (MR ratio), which corresponds to the SN ratio of the reading signal of the MRAM, resulting in a problem that the compatibility with the reading property is difficult. Recently, very large magnetoresistance ratios are reported mainly with respect to magnetic tunnel junctions having a structure of CoFeB/MgO/CoFeB. However, CoFeB is a material having magnetic anisotropy in the in-plane direction. In addition, magnetic tunnel junctions have been developed with various materials; however, most of them are materials having magnetic anisotropy in the in-plane direction. As for the perpendicular magnetic anisotropic material, there are very few achievements in which a magnetic tunnel junction is obtained with a high magnetoresistance ratio and high reliability.

It is therefore desirable in the domain wall motion type MRAM to improve write characteristics and read characteristics independently of each other.

DISCLOSURE OF INVENTION

In the domain wall motion type MRAM, it is desirable to improve write characteristics and read characteristics independently of each other. In this case, however, a structure of the magnetoresistance element becomes complicated, which is likely to increase variation in magnetization state between memory cells in which the same data value is stored. In particular, if variation in magnetization state between reference cells is increased, variation in a reference level at a time of data reading also is increased.

An object of the present invention is to provide a technique that can suppress the variation in the reference level at the time of data reading, with respect to the domain wall motion type MRAM.

In an exemplary embodiment of the present invention, a domain wall motion type MRAM is provided. The MRAM has: a memory cell; and a reference cell which is referred to for generating a reference level at a time of data reading. The memory cell includes a first magnetoresistance element, and the reference cell includes a second magnetoresistance element.

The first magnetoresistance element has: a first magnetization free layer having perpendicular magnetic anisotropy; a first magnetization fixed layer whose magnetization direction is fixed; a second magnetization free layer whose magnetization direction is variable; and a first nonmagnetic layer sandwiched between the first magnetization fixed layer and the second magnetization free layer. The first magnetization fixed layer and the second magnetization free layer have in-plane magnetic anisotropy. The first magnetization free layer has: a first magnetization fixed region whose magnetization direction is fixed; a second magnetization fixed region whose magnetization direction is fixed; and a magnetization free region whose magnetization direction is reversible and that is connected to the first magnetization fixed region and the second magnetization fixed region. The magnetization free region and the second magnetization free layer are magnetically coupled to each other. In a first plane parallel to each layer, center of the second magnetization free layer is displaced in a first direction from center of the magnetization free region.

The second magnetoresistance element has: a third magnetization free layer whose magnetization easy axis is parallel to a second direction; a second magnetization fixed layer whose magnetization direction is fixed in a third direction perpendicular to the second direction; and a second nonmagnetic layer sandwiched between the second magnetization fixed layer and the third magnetization free layer. The second magnetization fixed layer and the third magnetization free layer have in-plane magnetic anisotropy.

According to the present invention, it is possible to improve the write characteristics and the read characteristics independently of each other with respect to the domain wall motion type MRAM. Furthermore, it is possible to suppress the variation in the reference level at the time of data reading.

BRIEF DESCRIPTION OF DRAWINGS

The above and other objects, advantages and features of the present invention will be more apparent from the following description of certain exemplary embodiments taken in conjunction with the accompanying drawings.

FIG. 7 is a schematic view showing a configuration of a typical MRAM.

DESCRIPTION OF EMBODIMENTS

A magnetoresistance element and an MRAM based on the domain wall motion method according to an exemplary embodiment of the present invention will be described with reference to the attached drawings.

1. First Magnetoresistance Element 1-1. Configuration

Figure 1A:
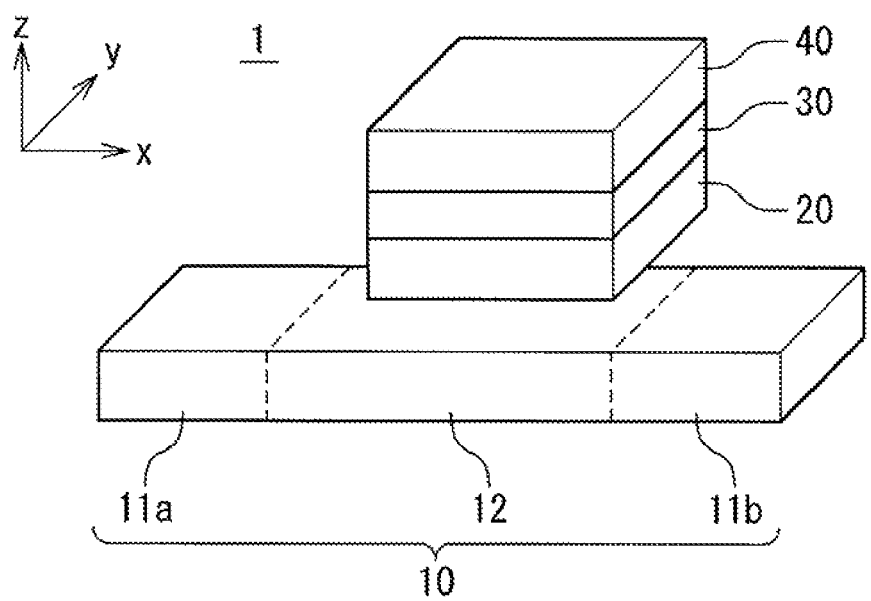
FIG. 1A is a perspective view showing a structure of a main portion of a first magnetoresistance element according to an exemplary embodiment of the present invention.
Figure 1B:
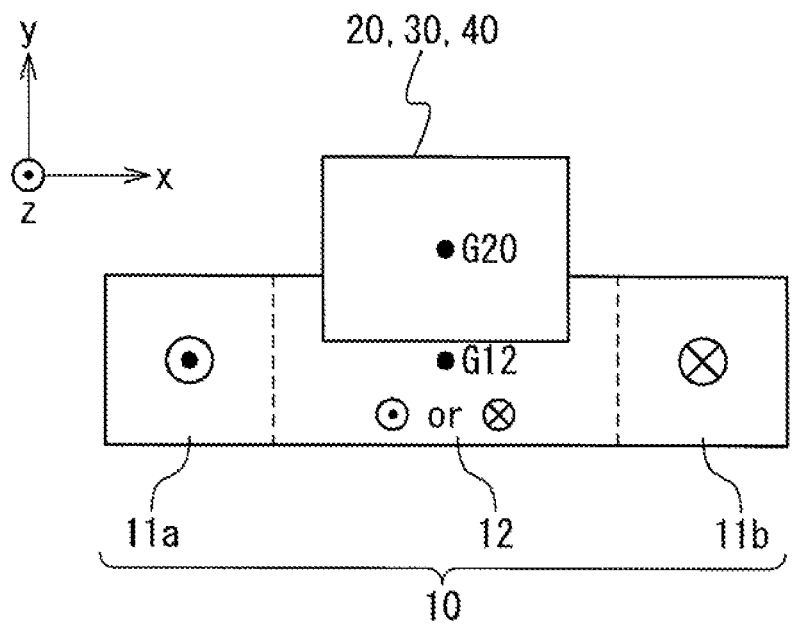
FIG. 1B is a plan view showing the structure of the main portion of the first magnetoresistance element shown in FIG. 1A.
Figure 1C:
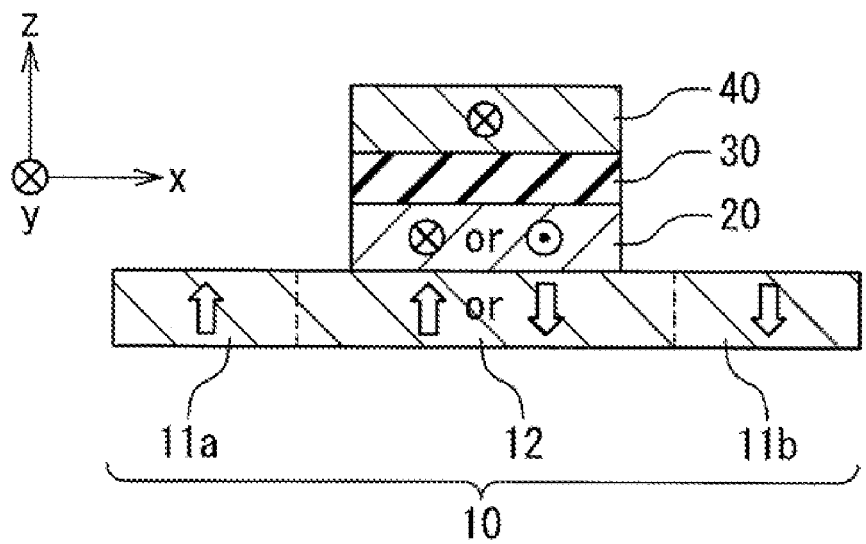
FIG. 1C is a cross-sectional view showing the structure of the main portion of the first magnetoresistance element shown in FIG. 1A.
Figure 1D:
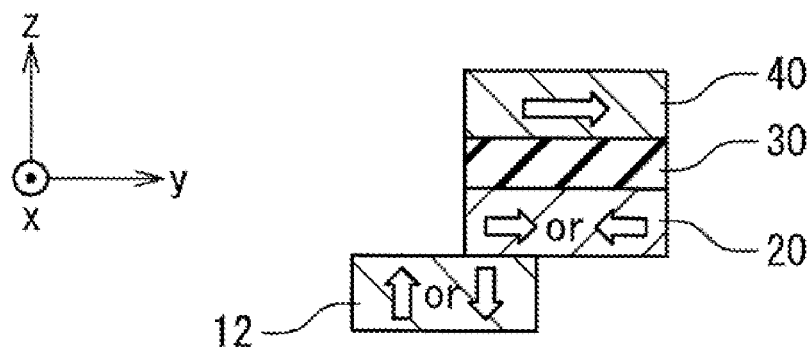
FIG. 1D is a cross-sectional view showing the structure of the main portion of the first magnetoresistance element shown in FIG. 1A.

FIGS. 1A to 1D schematically show a structure of a first magnetoresistance element 1 according to an exemplary embodiment of the present invention. More specifically, FIG. 1A is a perspective view, and FIG. 1B, FIG. 1C and FIG. 1D are an x-y plan view, an x-z cross-sectional view and a y-z cross-sectional view, respectively, in the x-y-z coordinate system shown in FIG. 1A.

The first magnetoresistance element 1 according to the present exemplary embodiment is provided with a first magnetization free layer 10, a second magnetization free layer 20, a first nonmagnetic layer 30 and a first magnetization fixed layer 40. The second magnetization free layer 20 is disposed adjacent to one surface of the first nonmagnetic layer 30, and the first magnetization fixed layer 40 is disposed adjacent to the other surface of the first nonmagnetic layer 30. That is, the first nonmagnetic layer 30 is sandwiched between the first magnetization fixed layer 40 and the second magnetization free layer 20.

The first magnetization free layer 10, the second magnetization free layer 20 and the first magnetization fixed, layer 40 are formed of ferromagnetic material. The first magnetization free layer 10 has perpendicular magnetic anisotropy in the film thickness direction (the z-axis direction in the figure), and the second magnetization free layer 20 and the first magnetization fixed layer 40 have in-plane magnetic anisotropy in the in-plane direction. In the present exemplary embodiment, the first nonmagnetic layer 30 is formed of insulator, and the second magnetization free layer 20, the first nonmagnetic layer 30 and the first magnetization fixed layer 40 form a magnetic tunnel junction (MTJ). Although being desirably formed of insulator, the first nonmagnetic layer 30 may be formed of semiconductor or conductor.

In the first magnetoresistance element 1, the first magnetization free layer 10 is composed of a first magnetization fixed region 11a, a second magnetization fixed region 11b and a magnetization free region 12. The magnetization free region 12 is formed between the first magnetization fixed region 11a and the second magnetization fixed region 11b. Moreover, the first magnetization free layer 10 is designed such that the magnetization free region 12 is magnetically coupled to at least a part of the second magnetization free layer 20. In other words, the first magnetization free layer 10 is designed so that a magnetization state of the magnetization free region 12 affects a magnetization state of the second magnetization free layer 20. The magnetization free region 12 is formed to be also electrically connected to the second magnetization free layer 20.

Each of the first magnetization fixed region 11a and the second magnetization fixed region 11b has a fixed magnetization in at least a portion thereof. Magnetization directions of the first magnetization fixed region 11a and the second magnetization fixed region 11b are fixed in the film thickness direction (the z-axis direction in the figure), and are oriented substantially anti-parallel to each other. On the other hand, a magnetization direction of the magnetization free region 12 is reversible and substantially parallel to one of the magnetizations of the first magnetization fixed region 11a and the second magnetization fixed region 11b. In the first magnetoresistance element 1 according to the present exemplary embodiment, the magnetization direction of the magnetization free region 12 corresponds to the stored data.

Also, the second magnetization free layer 20 has a reversible magnetization in the in-plane direction (the direction in the x-y plane), and a magnetization direction of the first magnetization fixed layer 40 is fixed in a predetermined direction in the in-plane direction (the direction in the x-y plane).

As mentioned above, the magnetization free region 12 and the second magnetization free layer 20 are magnetically coupled to each other. Preferably, center G12 of the magnetization free region 12 and center G20 of the second magnetization free layer 20 are designed to be displaced in the x-y plane. Consequently, as will be described later, the magnetization direction of the second magnetization free layer 20 is uniquely determined depending on the magnetization direction of the magnetization free region 12. Thus, the data stored as the magnetization direction of the magnetization free region 12 is transmitted to the second magnetization free layer 20 through the magnetic coupling between the magnetization free region 12 and the second magnetization free layer 20. FIGS. 1A to 1D show the example in which the center G20 of the second magnetization free layer 20 is displaced in the +y-direction with respect to the center G12 of the magnetization free region 12. However, the displacement direction is not limited to the +y-direction. In the x-y plane, the center G20 of the second magnetization free layer 20 just needs to be displaced in the "first direction" from the center G12 of the magnetization free region 12. It is desirable that the magnetization direction of the first magnetization fixed layer 40 is fixed in a direction parallel to or anti-parallel to the first direction.

It should be noted that the center here means geometric center in the x-y plane. That is, when the position vector of the center is represented by Rg=(Xg,Yg) and a position vector of an arbitrary point i is represented by Ri=(Xi,Yi), the position vector Rg of the center satisfies a relationship $\Sigma i(Ri-Rg)=0$. Here, $\Sigma i$ means summation with regard to i. For example, in cases of rectangle and parallelogram, the center is an intersection of diagonal lines, and in a case of ellipse, the center is a center of the ellipse.

Hereinafter, materials of the respective layers are exemplified. The first magnetization free layer 10 preferably includes at least one material selected from Fe, Co and Ni. Moreover, the perpendicular magnetic anisotropy can be stabilized by adding Pt, Pd and the like. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Concrete examples of the material include Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co and Gd—Tb—Fe—Co. Besides, the perpendicular magnetic anisotropy can be achieved also by stacking a layer including at least one material selected from Fe, Co and Ni and another layer. Concrete examples of the stacked film include Co/Pd, Co/Pt, Co/Ni and Fe/Au.

The second magnetization free layer 20 and the first magnetization fixed layer 40 preferably include at least one material selected from Fe, Co and Ni. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Specifically, Ni—Fe, Co—Fe, Fe—Co—Ni, Ni—Fe—Zr, Co—Fe—B, Co—Fe—Zr—B and the like are exemplified.

The first nonmagnetic layer 30 is desirably formed of insulator. Specifically, preferred materials of the first nonmagnetic layer 30 include Mg—O, Al—O, Al—N, Ni—O, Hf—O and the like. It should be noted, however, that the present invention can be implemented even when semiconductor or metal material other than these materials is used as the first nonmagnetic layer 30. Specifically, allowed materials of the first nonmagnetic layer 30 include Cr, Al, Cu, Zn and the like.

It should be noted that material which enhances the magnetoresistance ratio, which corresponds to the S/N ratio of the read signal, is preferably selected, for the second magnetization free layer 20, the first nonmagnetic layer 30 and the first magnetization fixed layer 40. For example, a Co—Fe—B/Mg—O/Co—Fe—B base MTJ is recently reported to have a very large magnetoresistance ratio around 500%. From this aspect, the second magnetization free layer 20 and the first magnetization fixed layer 40 are desirably formed of Co—Fe—B base material, and the first nonmagnetic layer 30 is desirably formed of Mg—O base material.

1-2. Principle

Figure 2A:
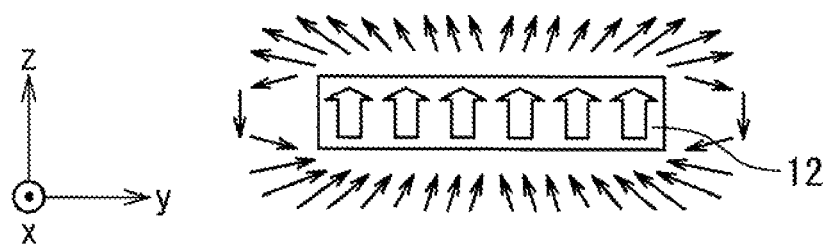
FIG. 2A is a cross-sectional view for explaining a state of magnetic flux regarding the first magnetoresistance element according to the present exemplary embodiment.

In the following, a detailed description is given of the magnetic coupling between the magnetization free region 12 and the second magnetization free layer 20, and the two states in which the magnetizations thereof are allowed in the first magnetoresistance element 1 by using FIGS. 2A to 2C. FIG. 2A is a schematic view showing the fact that the magnetization direction of the second magnetization free layer 20 is uniquely determined by the magnetization direction of the magnetization free region 12. In FIG. 2A, the magnetization of the magnetization free region 12 is assumed to be substantially oriented in one direction in the film thickness direction for simplicity. FIG. 2A schematically shows leakage magnetic flux from the magnetization free region 12. As shown in FIG. 2A, the leakage magnetic flux is required to be smoothly tied and thus the magnetic flux exhibits an increase in the component parallel to the in-plane direction as it goes toward the end of the magnetization free region 12. The magnetization direction of the second magnetization free layer 20 is determined by the component parallel to the in-plane direction of the magnetic flux.

Figure 2B:
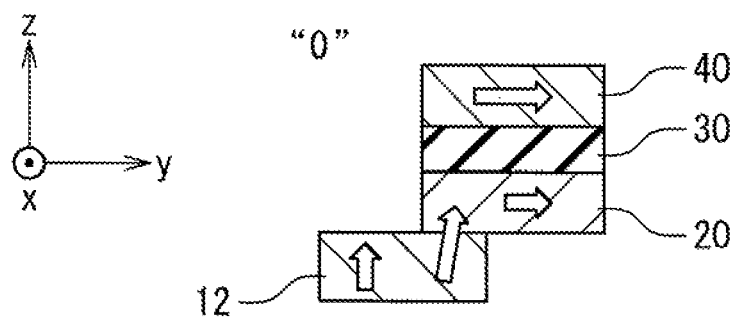
FIG. 2B is a cross-sectional view for explaining two states into which the first magnetoresistance element according to the present exemplary embodiment is allowed to be placed.
Figure 2C:
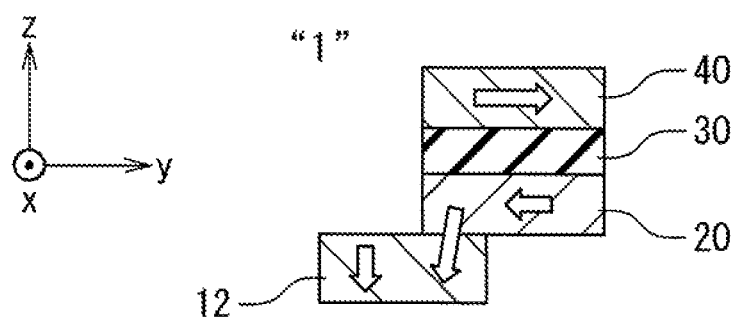
FIG. 2C is a cross-sectional view depicting two states into which the first magnetoresistance element according to the present exemplary embodiment is allowed to be placed.

FIGS. 2B and 2C schematically show the magnetization states of the respective layers in the "0" and "1" states in the first magnetoresistance element 1. It should be noted that the magnetization direction of the first magnetization fixed layer 40 may be the −y direction, although FIGS. 2B and 2C show that the magnetization direction of the first magnetization fixed layer 40 is fixed in the +y direction. Here, when the magnetization of the magnetization free region 12 is oriented in the +z direction as shown in FIG. 2B, the leakage magnetic flux as shown in FIG. 2A causes the magnetization of the second magnetization free layer 20 to have a component in the +y direction. Consequently, the magnetizations of the second magnetization free layer 20 and the first magnetization fixed layer 40 have components parallel to each other. When the magnetization of the magnetization free region 12 is oriented in the −z direction as shown in FIG. 2C, on the other hand, the leakage magnetic flux opposite to the direction in the case of FIG. 2A causes the magnetization of the second magnetization free layer 20 to have a component in the −y direction. Consequently, the magnetizations of the second magnetization free layer 20 and the first magnetization fixed layer 40 have components anti-parallel to each other. Since the center G20 of the second magnetization free layer 20 is positioned displaced in a particular direction (first direction) with respect to the center G12 of the magnetization free region 12 as mentioned above, the magnetization of the second magnetization free layer 20 has a positive or negative component along the particular direction depending on the magnetization direction of the magnetization free region 12. This results from the fact that the in-plane direction component of the leakage magnetic flux is distributed radially from the center G12 of the magnetization free region 12. Consequently, the magnetization of the second magnetization free layer 20 has the component parallel to or anti-parallel to the magnetization direction of the first magnetization fixed layer 90.

One important feature of the first magnetoresistance element 1 according to the present exemplary embodiment is that the data stored as the magnetization component in the perpendicular direction in the magnetization free region 12 is transmitted to the magnetization component in the in-plane direction of the second magnetization free layer 20 by the magnetic coupling. Thus, the magnetizations of the second magnetization free layer 20 and the magnetization free region 12 may be correlated by using any type of magnetic coupling, for example, the use of the exchange coupling and the like, not limited to the method of using the leakage magnetic flux.

It should be noted that the direction of the magnetization easy axis of the second magnetization free layer 20 is arbitrary, as long as the magnetization direction of the second magnetization free layer 20 can be changed depending on the magnetization of the magnetization free region 12. Therefore, the direction of the magnetization easy axis of the second magnetization free layer 20 may be oriented in the y-direction or in the x-direction. The case of the orientation to the y-direction results in the magnetization reversal between the magnetization easy axes, while the case of the orientation to the x-direction results in the magnetization rotation to the hard axis direction with the magnetization easy axis as a center. Moreover, the magnetic anisotropy of the second magnetization free layer 20 may be given by a crystal magnetic anisotropy or by a shape magnetic anisotropy.

1-3. Data Writing Method, Data Reading Method

The data writing to the first magnetoresistance element 1 according to the present exemplary embodiment is achieved by moving the domain wall formed within the first magnetization free layer 10. As mentioned above, the first magnetization free layer 10 has: the first magnetization fixed region 11a and the second magnetization fixed region 11b, in which the magnetizations are fixed substantially antiparallel to each other in the film thickness direction; and the magnetization free region 12 which is electrically connected to them. The magnetization of the magnetization free region 12 is substantially parallel to one of the first magnetization fixed region 11a and the second magnetization fixed region 11b. With this restriction of the magnetization state, the domain wall is introduced into the first magnetization free layer 10. For example, when the magnetization of the magnetization free region 12 is substantially parallel to the magnetization of the first magnetization fixed region 11a and substantially anti-parallel to the magnetization of the second magnetization fixed region 11b, the domain wall is formed near the boundary between the magnetization free region 12 and the second magnetization fixed region 11b. Also, when the magnetization of the magnetization free region 12 is substantially parallel to the magnetization of the second magnetization fixed region 11b and substantially anti-parallel to the magnetization of the first magnetization fixed region 11a, the domain wall is formed near the boundary between the magnetization free region 12 and the first magnetization fixed region 11a.

The position of the formed domain wall can be moved by directly feeding a current within the first magnetization free layer 10. For example, when the domain wall is formed near the boundary between the magnetization free region 12 and the first magnetization fixed region 11a, conduction electrons are fed from the first magnetization fixed region 11a to the magnetization free region 12 by supplying a current in the direction from the magnetization free region 12 to the first magnetization fixed region 11a, and thereby the domain wall moves in the same direction as the flow of the conduction electrons. With the movement of the domain wall, the magnetization of the magnetization free region 12 is oriented parallel to the first magnetization fixed region 11a. Also, when the domain wall is formed near the boundary between the magnetization free region 12 and the second magnetization fixed region 11b, conduction electrons are fed from the second magnetization fixed region 11b to the magnetization free region 12 by supplying a current in the direction from the magnetization free region 12 to the second magnetization fixed region 11b, and thereby the domain wall moves in the same direction as the flow of the conduction electrons. With the movement of the domain wall, the magnetization of the magnetization free region 12 is oriented parallel to the second magnetization fixed region 11b. In this manner, the data can be rewritten between the "0" state and the "1" state.

Actually, terminals connected to external interconnections are desirably provided for the first magnetization fixed region 11a and the second magnetization fixed region 11b, to introduce the write current as described above. In this case, the write current is supplied between a first terminal connected to the first magnetization fixed region 11a and a second terminal connected to the second magnetization fixed region 11b. However, the route of the write current for writing data into the first magnetoresistance element 1 according to the present exemplary embodiment is not limited to this; other possible methods will be described later.

A description is next given of the reading method of the data from the first magnetoresistance element 1 according to the present exemplary embodiment. The magnetoresistance effect is used to read the data from the first magnetoresistance element 1 according to the present exemplary embodiment. More specifically, the data is read by supplying a current between the first magnetization fixed layer 40 and the second magnetization free layer 20 through the first nonmagnetic layer 30 and detecting the resistance value which depends on a relative angle between the magnetizations of the first magnetization fixed layer 40 and the second magnetization free layer 20. For example, when the magnetizations of the first magnetization fixed layer 40 and the second magnetization free layer 20 have the parallel components as shown in FIG. 2B, the low resistance state is generated, and when the magnetizations of the first magnetization fixed layer 40 and the second magnetization free layer 20 have the anti-parallel components as shown in FIG. 2C, the high resistance state is generated. The resistance value of the first magnetoresistance element 1 is detected as a voltage signal or a current signal, and the voltage signal or the current signal is used to determine the data stored in the first magnetoresistance element 1.

In the first magnetoresistance element 1 according to the present exemplary embodiment, as described above, the first magnetization free layer 10 is used at the time of the data writing. In this sense, the first magnetization free layer 10 is referred to as a "write layer". On the other hand, the second magnetization free layer 20, the first nonmagnetic layer 30 and the first magnetization fixed layer 40 are used at the time of the data reading. In this sense, the second magnetization free layer 20, the first nonmagnetic layer 30 and the first magnetization fixed layer 40 are referred to as a "read layer group". According to the present exemplary embodiment, the write layer and the read layer group are separately provided but are mutually related through the magnetic coupling. To put it the other way around, the information transmission through the magnetic coupling makes it possible to provide the write layer for use in the writing and the read layer group for use in the reading separately from each other. It is therefore possible to optimize the write layer and the read layer group independently of each other such that desired characteristics are obtained respectively, which enables both improvement in the write characteristics and improvement in the read characteristics simultaneously. For example, a perpendicular magnetization film having appropriate material characteristics can be applied to the write layer in order to reduce the write threshold current density, while an MTJ exhibiting a high MR ratio can be applied to the read layer group.

1-4. Technical Advantages

The first technical advantage of the first magnetoresistance element 1 according to the present exemplary embodiment lies in the decrease in the write current. This results from the fact that the first magnetization free layer 10, in which the domain wall motion occurs when the data is written, has the magnetic anisotropy in the perpendicular direction. The inventor found out by a micro magnetic calculation using an LLG equation in which a spin transfer torque is considered that the domain wall formed of material having the perpendicular magnetic anisotropy is advantageous as compared with the domain wall formed of material having the in-plane magnetic anisotropy in that the current density required for driving is sufficiently reduced and the magnetic field required for driving becomes sufficiently great. As described in Europhysics Letters, vol. 69, pp. 990-996 (2005), according to the LLG equation in which the spin transfer torque is considered, the time variation of the magnetization ($\partial m/\partial t$) is represented as the sum of: [1] a term representing a torque caused by the magnetic field; [2] a damping term; [3] an adiabatic spin torque term; and [4] a non-adiabatic spin torque term. The micro magnetic calculation has proved that the domain wall formed of material having the perpendicular magnetic anisotropy is driven by the [3] adiabatic spin torque term even with the current density of about $1 \times 10^8$ [A/cm2], while the domain wall in the in-plane magnetization film is not driven with the current density of about $1 \times 10^8$ [A/cm2] unless there is an effect of the [4] non-adiabatic spin torque term. Here, it is known in the case of the domain wall drive based on the [3] adiabatic spin torque term that the domain wall can be de-pinned from the pinning site independently of the pinning magnetic field, for the pinning that is not excessively large. Thus, as for the material having the perpendicular magnetic anisotropy in which the domain wall drive based on the [3] adiabatic spin torque term is possible, it can be understood that both of the pinning of the strong domain wall and the domain wall drive based on the low current density are easily attained, as compared with the material having the in-plane magnetic anisotropy in which the domain wall drive based on the [3] adiabatic spin torque term is impossible. That is, the use of material having the perpendicular magnetic anisotropy reduces the current required for the data writing, while keeping the sufficient value as the thermal stability.

For example, as a simple example, let us consider a configuration in which the width (w) of the first magnetization free layer 10 is 100 nm, the film thickness (t) of the first magnetization free layer 10 is 2 nm, the half of the width (qO) of the pinning site of the domain wall is 15 nm, the saturation magnetization (MS) of the first magnetization free layer 10 is 500 [emu/cm3], the spin polarizability (P) is 0.5, and the de-pin magnetic field (HC) of the pinning site of the domain wall is 1000 [Oe]. In this case, the thermal stability index $\Delta E/kBT$ is about 40, where kB is the Boltzmann' constant and T is the absolute temperature. It was found from the micro magnetic calculation that the current density required for de-pinning the domain wall from the pinning site for this configuration is about $2 \times 10^7$ [A/cm2]. In this case, the write current of the element becomes 0.04 [mA].

On the other hand, as a structure to attain the same thermal stability index ($\Delta E/kBT=40$) by using the material that has the in-plane magnetic anisotropy, let us consider a configuration in which the width (w) of the first magnetization free layer 10 is 100 nm, the film thickness (t) of the magnetization free layer is 10 nm, the half of the width (qO) of the pinning site of the domain wall is 40 nm, the saturation magnetization (MS) is 800 [emu/cm3], the spin polarizability (P) is 0.7, and the de-pinning magnetic field (HC) of the pinning site of the domain wall is 50 [Oe], for example. It was found from the micro magnetic calculation that the current density required for de-pinning the domain wall from the pinning site in such the configuration is about $6 \times 10^8$ [A/cm2]. Although the use of such a high current density in the element is not practical from the viewpoint of the heat generation and the electromigration effect, the value of this current density is used for comparison. In this case, the write current to be fed to the element with the in-plane magnetization film is 6 [mA]. As thus discussed, it can be understood that the use of the material having the perpendicular magnetic anisotropy in the layer in which the domain wall motion occurs achieves a remarkable decrease in the write current.

It should be noted that the parameters of the first magnetoresistance element 1 used in this context are just examples, and the parameters of the first magnetoresistance element 1 may be variously changed. Thus, the current value necessary for the writing and the thermal stability $\Delta E/kBT$ are changed according to changes in the parameter; however, the magnitude relation between the write currents of the in-plane magnetization film and the perpendicular magnetization film is not greatly overturned, since the current value and the thermal stability are changed while they are substantially associated.

Moreover, it was found from the micro magnetic calculation that the current density required for driving the domain wall by a current is decreased as the film thickness is reduced in the case of the material having the perpendicular magnetic anisotropy, which is different from the case of the material having the in-plane magnetic anisotropy. As the film thickness is reduced, the total current quantity is naturally decreased. In the case of the perpendicular magnetic anisotropy material, the current density is further decreased. Therefore, the write current can be reduced effectively by using the perpendicular magnetic anisotropy material.

The second technical advantage of the first magnetoresistance element 1 according to the present exemplary embodiment lies in the increase in the read signal. This result from the fact that the data stored in the first magnetization free layer 10, which having the perpendicular magnetic anisotropy is transmitted to the second magnetization free layer 20 which has the in-plane magnetic anisotropy, and the MTJ used for the data reading is comprised of ferromagnetic layers having the magnetization in the in-plane direction. Use of Co—Fe—B/Mg—O/Co—Fe—B base material or the like for the ferromagnetic layers of the MTJ allows achieving a further higher MR ratio.

The third technical advantage of the first magnetoresistance element 1 according to the present exemplary embodiment lies in the solution of the tradeoff between the write and read operations, and facilitation of the manufacture process. This results from the fact that the first magnetization free layer 10 for the data writing and the second magnetization free layer 20 for the data reading can be independently designed. In a case of a generally-used MRAM of a magnetic field writing type, for example, the magnetic anisotropy of the element is generally increased and the current necessary for the writing is thereby increased, when material having the high spin polarization ratio such as Co—Fe and the like is used in order to increase the read signal. However, in the first magnetoresistance element 1 according to the present exemplary embodiment, the decrease in the write current and the increase in the read signal can be achieved by adjusting the respective properties of the different layers, and thus the foregoing tradeoff can be solved. In addition to that, the first magnetization free layer 10 and the second magnetization free layer 20 are allowed to be separately manufactured, which makes the manufacturing process easy.

The fourth technical advantage of the first magnetoresistance element 1 according to the present exemplary embodiment lies in the reduction of the cost resulting from the omission of a magnetic shield or the reduction in the requirements for the magnetic shield. This is because the perpendicular magnetic anisotropy material used for the first magnetization free layer 10 that serves as the data storage layer has a sufficiently large crystal magnetic anisotropy and thus the durability against the external disturbance magnetic field is extremely larger as compared with the in-plane magnetization film. The use of material having the in-plane magnetic anisotropy inevitably requires a magnetic shield under actual use conditions, while the present invention does not require a magnetic field to insure the external disturbance magnetic field resistance, or even if this is required, requirements for ability of the magnetic shield is reduced, which enables the reduction of the manufacture cost.

1-5. First Modification Example

Figure 3A:
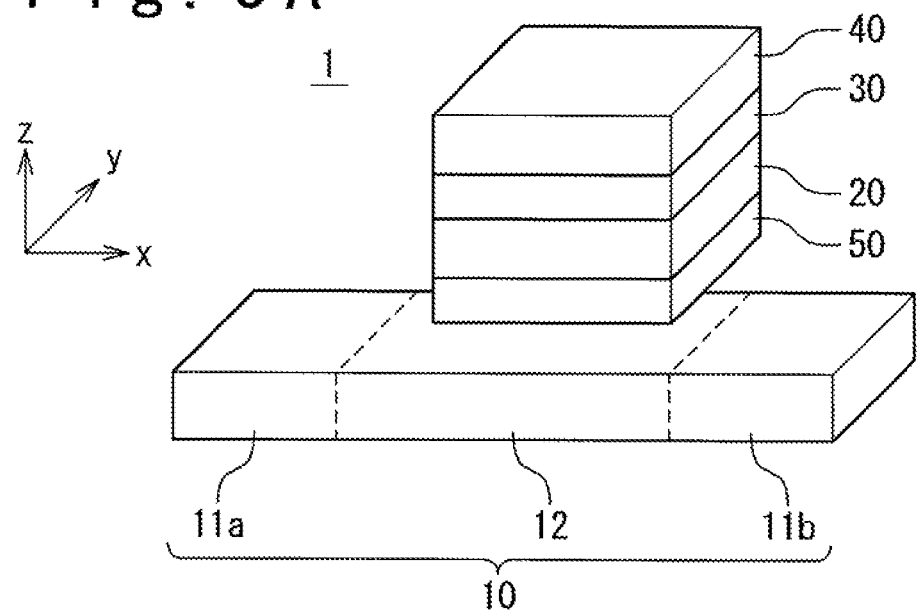
FIG. 3A is a perspective view showing a configuration of a first modification example of the first magnetoresistance element according to the present exemplary embodiment.
Figure 3B:
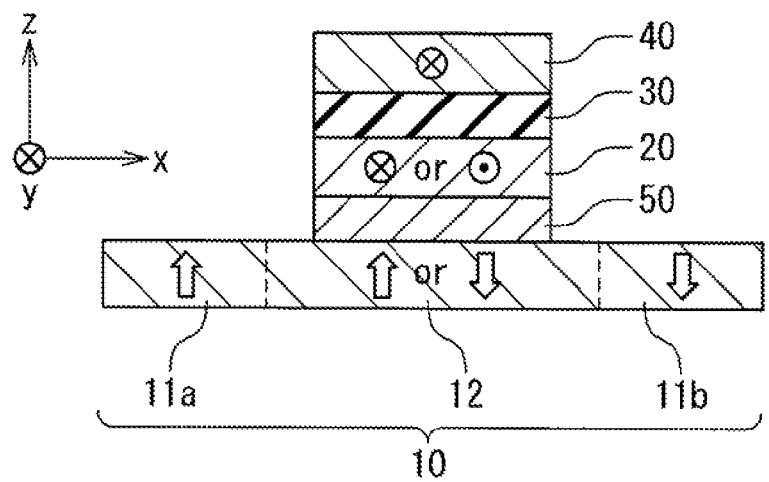
FIG. 3B is a cross-sectional view showing the configuration of the first magnetoresistance element shown in FIG. 3A.
Figure 3C:
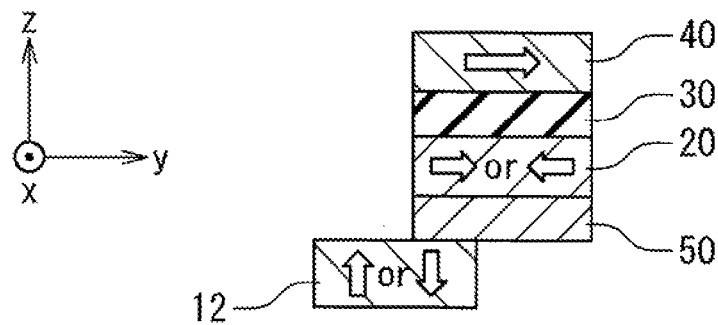
FIG. 3C is a cross-sectional view showing the configuration of the first magnetoresistance element shown in FIG. 3A.

FIGS. 3A to 3C schematically show a first modification example of the first magnetoresistance element 1. Among them, FIG. 3A is a perspective view, FIG. 3B is a x-z cross-sectional view in FIG. 3A and FIG. 3C is a y-z cross-sectional view in FIG. 3A.

In detail, in the first modification example, a conductive layer 50 is formed between the first magnetization free layer 10 and the second magnetization free layer 20. The conductive layer 50 is formed of a conductor. It should be noted that the conductive layer 50 may be magnetic or nonmagnetic. The conductive layer 50 also has a role for provide an electrical connection between the first magnetization free layer 10 and the second magnetization free layer 20.

As for the shape of the conductive layer 50, the conductive layer 50 may be formed only under the second magnetization free layer 20 as shown in FIGS. 3A and 3B, or may be formed to entirely cover the upper surface of the first magnetization free layer 10 and the lower surface of the second magnetization free layer 20. Also, although not shown in the drawings, the conductive layer 50 may be formed to cover only at least parts of the second magnetization free layer 20 and the first magnetization free layer 10.

The formation of the conductive layer 50 facilitates the manufacturing process. This is because the upper and lower portions of the conductive layer 50 can be separately formed. Here, the conductive layer 50 can serve as a cap layer of a layer under the conductive layer 50 and serve as a base layer of the layer on the conductive layer 50. This avoids the oxidization and chemical deterioration of the layer under the conductive layer 50, and provides control of the crystal orientation and protection from the chemical deterioration for the layer on the conductive layer 50. Also, the formation of the conductive layer 50 provides an improved electrical connection between the first magnetization free layer 10 and the second magnetization free layer 20.

Also, when magnetic material is used for the conductive layer 50, the data of the magnetization of the magnetization free region 12 of the first magnetization free layer 10 can be efficiently transmitted to the second magnetization free layer 20. To this end, material having high magnetic permeability is desired to be used for the conductive layer 50. This makes it easier to reverse the magnetization of the second magnetization free layer 20. In order to efficiently transmit the data of the magnetization of the magnetization free region 12 to the second magnetization free layer 20 by using the conductive layer 50, the material of the conductive layer 50 desirably includes at least one element of Fe, Co and Ni.

1-6. Second Modification Example

Figure 4A:
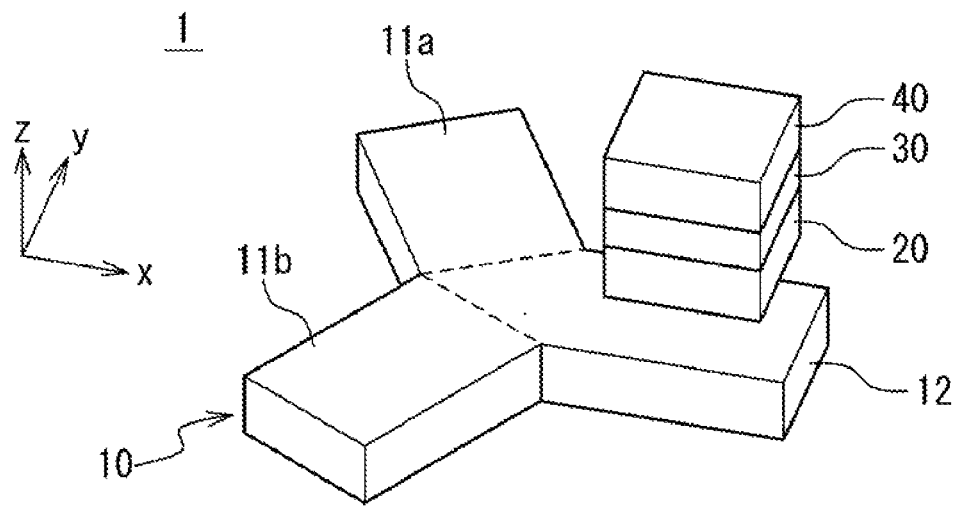
FIG. 4A is a perspective view showing still another configuration of a second modification example of the first magnetoresistance element according to the present exemplary embodiment.
Figure 4B:
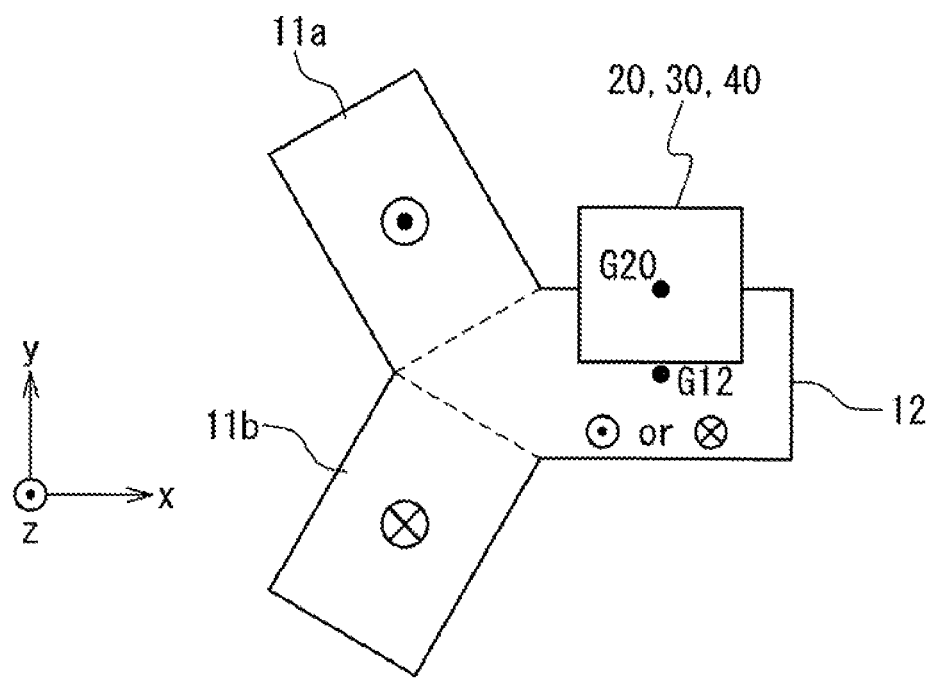
FIG. 4B is a plan view showing the configuration of the first magnetoresistance element shown in FIG. 4A.

FIGS. 4A and 4B schematically show a second modification example of the first magnetoresistance element 1. FIG. 4A is a perspective view, and FIG. 4B is an x-y plan view.

Also in the structure shown in FIGS. 4A and 4B, the first magnetization free layer 10 is provided with the first magnetization fixed region 11a, the second magnetization fixed region 11b and the magnetization free region 12. However, the first magnetization fixed region 11a and the second magnetization fixed region 11b are connected to one end of the magnetization free region 12, differently from the foregoing configuration in which the first magnetization fixed region 11a is connected to one end of the magnetization free region 12 and the second magnetization fixed region 11b is connected to the other end. That is, the first magnetization fixed region 11a, the second magnetization fixed region 11b and the magnetization free region 12 form a three-way intersection. It should be noted that the positional relation between the respective layers and the magnetic properties in the structure shown in FIGS. 4A and 4B are the same as described above. That is, the first magnetization free layer 10 has the perpendicular magnetic anisotropy, and on the other hand, the second magnetization free layer 20 and the first magnetization fixed layer 40 have the in-plane magnetic anisotropy. Moreover, the center G20 of the second magnetization free layer 20 is displaced in the "first direction" from the center G12 of the magnetization free region 12 in the x-y plane. Furthermore, the magnetizations of the first magnetization fixed region 11a and the second magnetization fixed region that configure the first magnetization free layer 10 are fixed in the anti-parallel directions to each other in the film thickness direction.

The first magnetoresistance element 1 shown in FIGS. 4A and 4B is a four-terminal element. One of the four terminals is disposed on the first magnetization fixed layer 40, other two terminals are respectively disposed on the first magnetization fixed region 11a and the second magnetization fixed region 11b, and the remaining one terminal is disposed on the magnetization free region 12. Also in the structure shown in FIGS. 4A and 4B, the domain wall is formed in the vicinity of one of the boundary between the first magnetization fixed region 11a and the magnetization free region 12 and the boundary between the second magnetization fixed region 11b and the magnetization free region 12. Moreover, in the structure shown in FIGS. 4A and 4B, the data writing is performed by supplying a current between the first magnetization fixed region 11a and the magnetization free region 12 or between the second magnetization fixed region 11b and the magnetization free region 12. In this case, the writing results in that the domain wall starts to move from the boundary between the first magnetization fixed region 11a or the second magnetization fixed region 11b and the magnetization free region 12 and goes out from the other end of the magnetization free region 12.

1-7. Third Modification Example

Figure 5A:
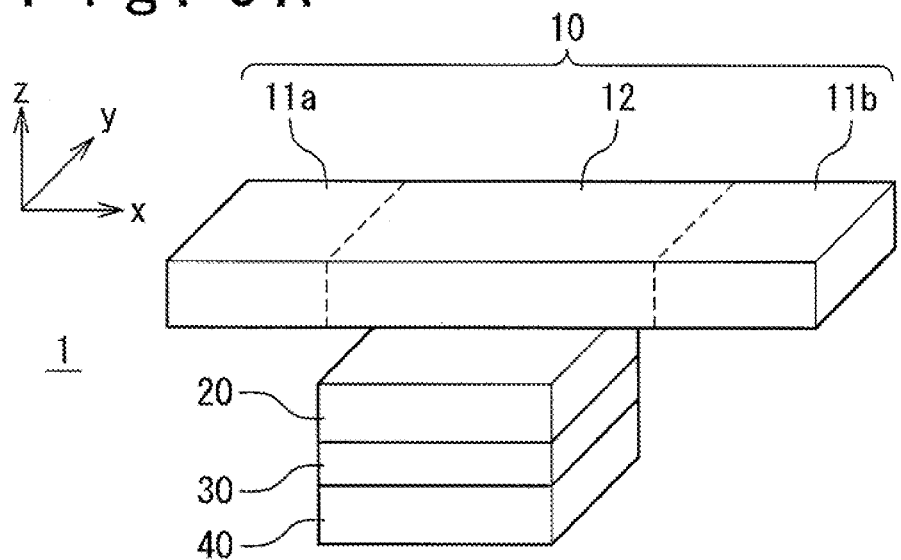
FIG. 5A is a perspective view showing a configuration of a third modification example of the first magnetoresistance element according to the present exemplary embodiment.
Figure 5B:
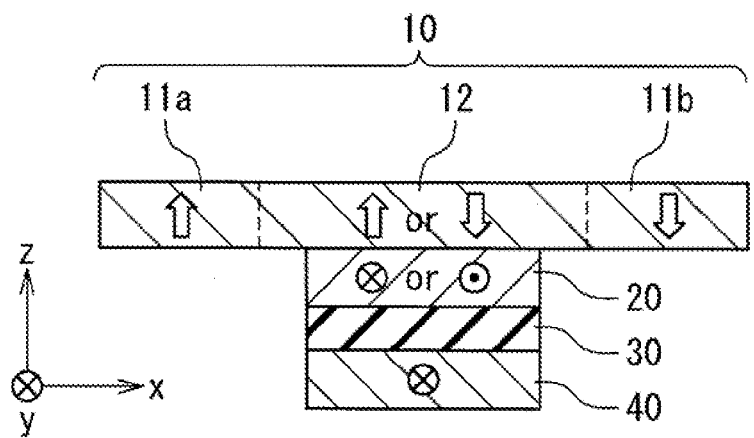
FIG. 5B is a cross-sectional view showing the configuration of the first magnetoresistance element shown in FIG. 5A.
Figure 5C:
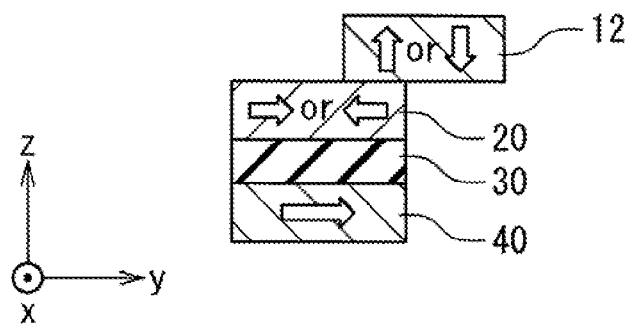
FIG. 5C is a cross-sectional view showing the configuration of the first magnetoresistance element shown in FIG. 5A.

FIGS. 5A to 5C schematically show a third modification example of the first magnetoresistance element 1. FIG. 5A is a perspective view, FIG. 5B is a x-z cross-sectional view, and FIG. 5C is a y-z cross-sectional view. In the first magnetoresistance element 1 according to the present exemplary embodiment, the second magnetization free layer 20, the first nonmagnetic layer 30 and the first magnetization fixed layer 40 just need to be successively placed in this order, and the lamination order of them and the first magnetization free layer 10 is arbitrary. Thus, as shown in FIGS. 5A to 5C, the first magnetization free layer 10 may be formed in the top layer. Also in this case, the centers of the magnetization free region 12 and the second magnetization free layer 20 are displaced in the x-y plane, while the displacement direction is arbitrary.

1-8. Fourth Modification Example

Figure 6A:
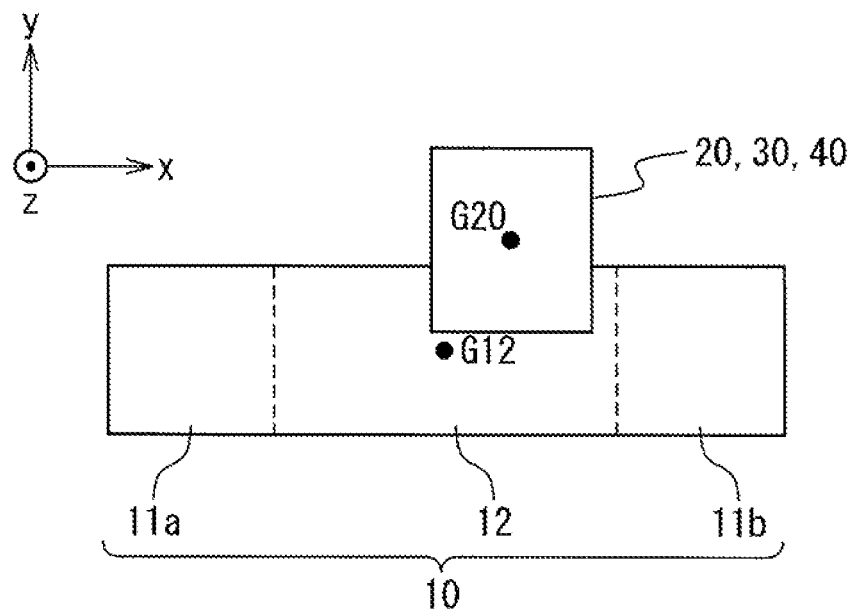
FIG. 6A is a plan view showing a configuration of a fourth modification example of the first magnetoresistance element according to the present exemplary embodiment.
Figure 6B:
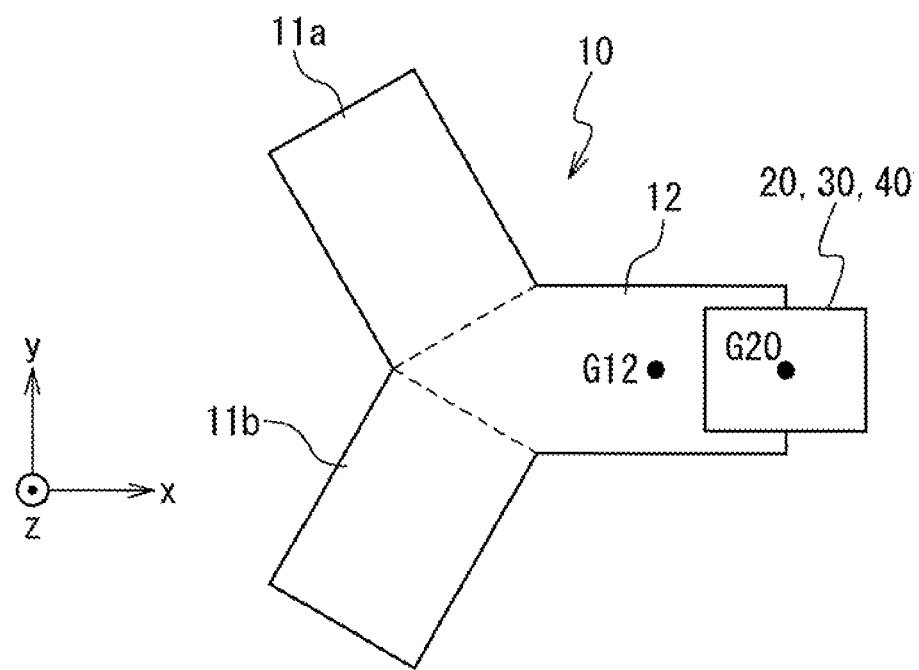
FIG. 6B is a plan view showing another configuration of the fourth modification example of the first magnetoresistance element according to the present exemplary embodiment.

FIG. 6A is a plan view that schematically shows a structure of a fourth modification example of the first magnetoresistance element 1. In the present exemplary embodiment, the center G20 of the second magnetization free layer 20 is displaced in a particular direction in the in-plane direction (the direction parallel to the x-y plane) with respect to the center G12 of the magnetization free region 12 of the first magnetization free layer 10. Although this particular direction is so depicted as to be in a direction substantially parallel to the +y direction in the foregoing drawings, this particular direction can be determined arbitrarily. Thus, as shown in FIG. 6A, the particular direction may have an x-component. Also, when the first magnetization free layer 10 has a three-way intersection as described in the second modification example, the positional relation between the center G20 of the second magnetization free layer 20 and the center G12 of the magnetization free region 12 as shown in FIG. 6B also is allowable.

It should be noted that the examples described above can be combined as long as no contradiction arises.

2. Variation in Reference Level

FIG. 7 schematically shows a configuration of a typical MRAM. A memory cell array of the MRAM has a plurality of cells that are arranged in a matrix form. More specifically, the cells include memory cells MC used for storing data and reference cells RC0 and RC1 that are referred to for generating a reference level at the time of data reading. The memory cell MC and the reference cells RC0 and RC1 have the same structured magnetoresistance element.

A data "0" or a data "1" is stored in the memory cell MC. A resistance value of the magnetoresistance element of the memory cell MC is R0 in the case of the data "0" and R1 in the case of the data "1". The reference cell RC0 is set to the data "0" and the resistance value of the magnetoresistance element thereof is R0. On the other hand, the reference cell RC1 is set to the data "1" and the resistance value of the magnetoresistance element is R1. Such setting of the reference cells RC0 and RC1 is performed in the same manner as the data writing to the memory cell MC, and a set controller dedicated to that procedure is provided.

At the time of data reading, the read current is supplied to the reference cells RC0 and RC1 in addition to a read-target memory cell MC. Based on the read current flowing in the memory cell MC, a read circuit generates a read-out level depending on the memory data of the memory cell MC. Moreover, based on the read currents flowing in the respective reference cells RC0 and RC1, the read circuit generates a reference level corresponding to an intermediate resistance value of the resistance values R0 and R1. Then, the read circuit compares the read-out level with the reference level to determine the memory data of the memory cell MC.

Here, let us consider a case where the above-described first magnetoresistance element 1 is applied to the memory cell MC and the reference cells RC0 and RC1. In the first magnetoresistance element 1, as described above, the write layer (10) and the read layer group (20 to 40) are separated from each other in order to improve the write characteristics and the read characteristics independently of each other. The magnetization state of the second magnetization free layer 20 of the read layer group, namely, the MTJ resistance value of the read layer group is remotely determined depending on the magnetization state of the magnetization free region 12 of the first magnetization free layer 10.

In the case of this structure, there is a possibility that the MTJ resistance value (R0 or R1) of the read layer group varies even between the memory cells MC in which the same data is stored. The same applies to the reference cells RC0 and RC1. The resistance value R0 of the read layer group may vary between the reference cells RC0 that are set to the data "0", and the resistance value R1 of the read layer group may vary between the reference cells RC1 that set to the data "1". In the case where the reference level is generated by referring to the two kinds of reference cells RC0 and RC1 as described above, increase in the variation in the resistance values of the respective reference cells RC0 and RC1 causes increase in variation in the reference level. The variation in the reference level means an uncertain reference level, which increases probability of erroneous data reading.

An example of the variation in the reference level will be described below with reference to FIGS. 8 to 11.

Figure 8:
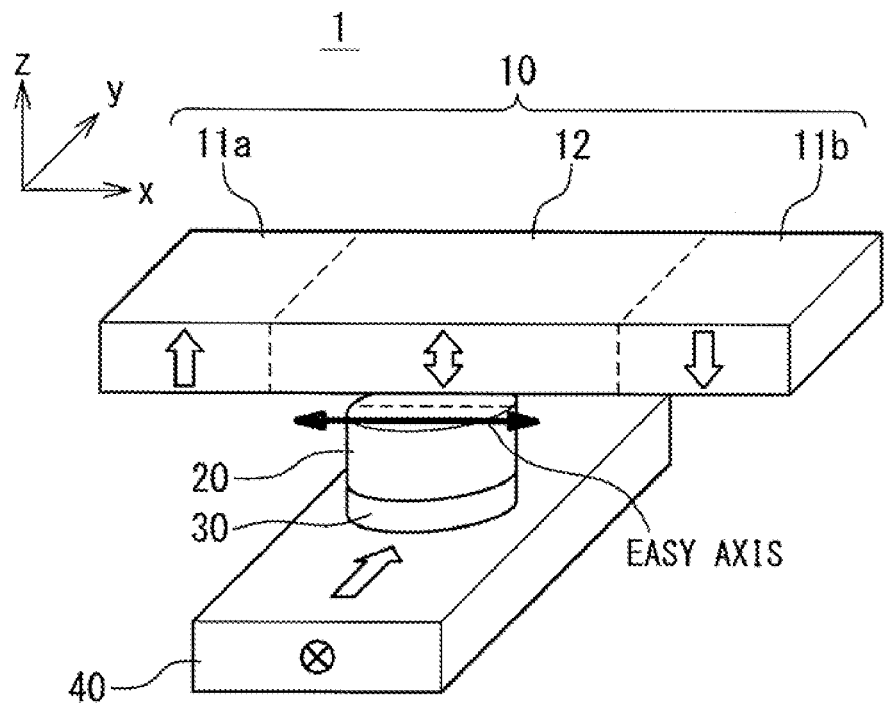
FIG. 8 is a perspective view showing an example of the first magnetoresistance element according to the exemplary embodiment of the present invention.
Figure 9:
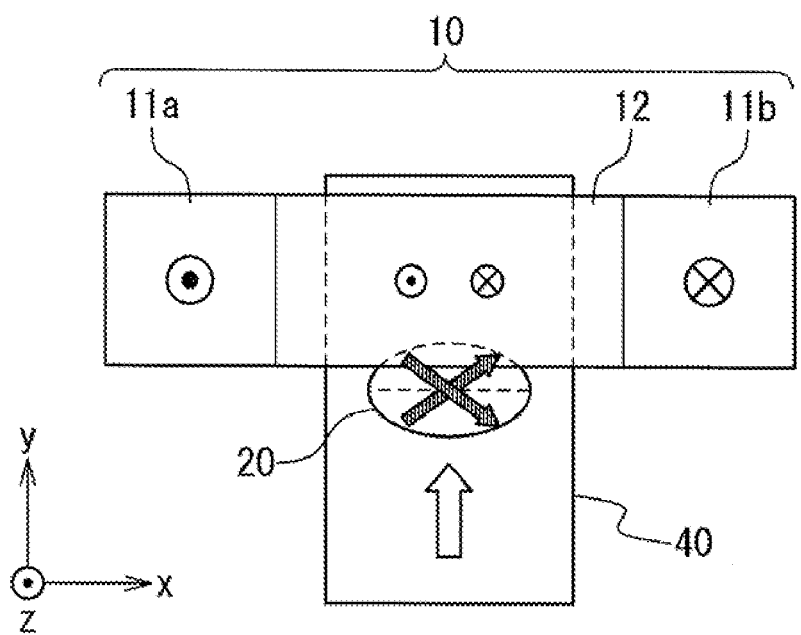
FIG. 9 is a plan view showing magnetization state of the first magnetoresistance element shown in FIG. 8.

FIG. 8 is a perspective view showing an example of the first magnetoresistance element 1, and FIG. 9 is a plan view showing magnetization state of the first magnetoresistance element 1 shown in FIG. 8. In the example shown in FIG. 8 and FIG. 9, the displacement direction (first direction) of the second magnetization free layer 20 with respect to the magnetization free region 12 of the first magnetization free layer 10 is the y-direction and the magnetization easy axis of the second magnetization free layer 20 is along the x-direction perpendicular to the y-direction. In this case, the perpendicular magnetization of the magnetization free region 12 applies a magnetization component in the +y-direction or in the −y-direction to the second magnetization free layer 20 and, as shown in FIG. 9, the magnetization of the second magnetization free layer 20 rotates toward the magnetization hard axis (y-axis) direction from the magnetization easy axis (x-axis) as a center. Meanwhile, the magnetization direction of the first magnetization fixed layer 40 is fixed parallel to or anti-parallel to the first direction and is perpendicular to the magnetization easy axis of the second magnetization free layer 20. As a result, difference in a relative angle of the magnetization direction between the second magnetization, free layer 20 and the first magnetization fixed layer 40 is caused, which achieves the two memory states: the data "0" and the data "1".

Figure 10:
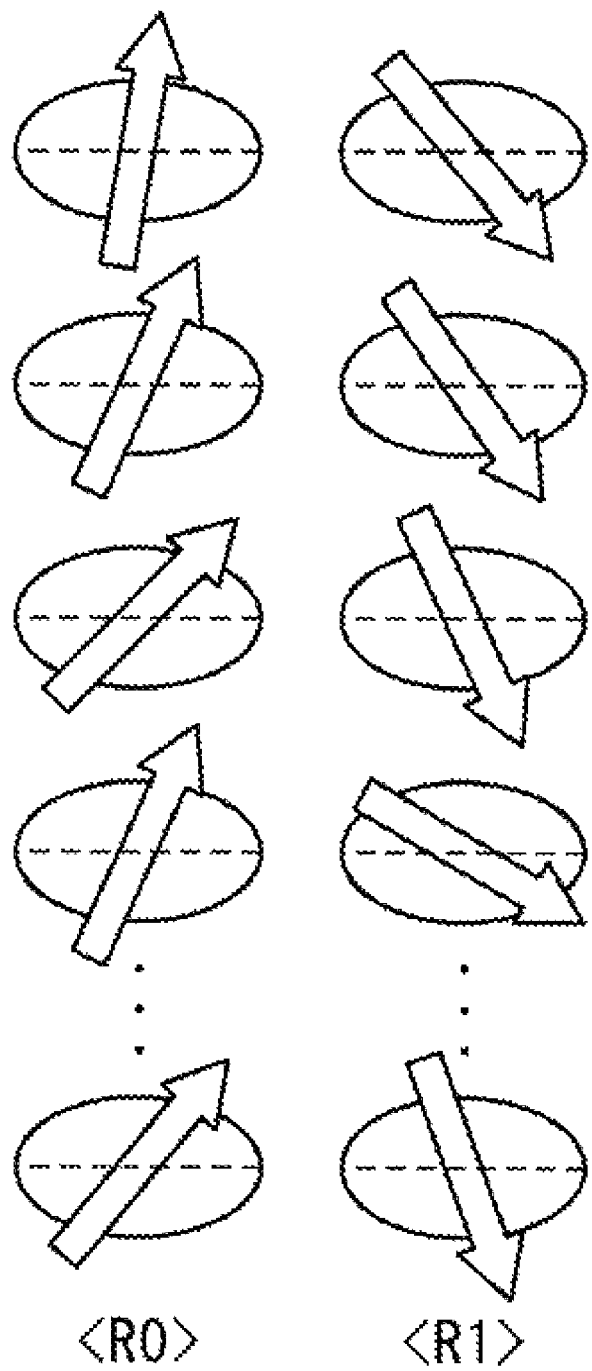
FIG. 10 is a conceptual diagram showing variation in the magnetization state.

In the case where the first magnetoresistance element 1 shown in FIGS. 8 and 9 is applied to the memory cell MC and the reference cells RC0 and RC1, variation in the magnetization state of the second magnetization free layer 20 of the read layer group is caused as shown in FIG. 10. That is, in a cell having comparatively large magnetic anisotropy of the second magnetization free layer 20, the rotation amount of the magnetization with respect to the magnetization easy axis becomes small. Conversely, in a cell having comparatively small magnetic anisotropy of the second magnetization free layer 20, the rotation amount of the magnetization with respect to the magnetization easy axis becomes large. Such a variation in the rotation amount of the magnetization means variation in the MTJ resistance value (R0 or R1) of the read layer group. That is to say, the resistance value R0 varies between the reference cells RC0 that are set to the data "0", and the resistance value R1 varies between the reference cells RC1 that are set to the data "1".

Figure 11:
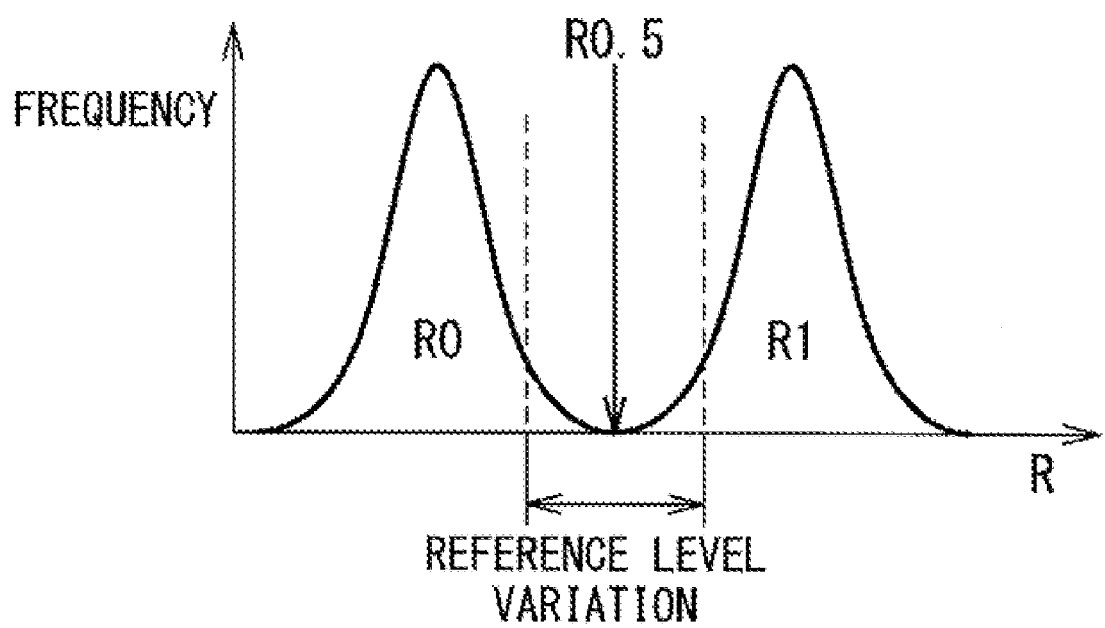
FIG. 11 is a histogram for explaining variation in a reference level.

FIG. 11 conceptually shows distributions of the data "0" cells and the data "1" cells, and a perpendicular axis and a horizontal axis thereof respectively represent frequency and the MTJ resistance value. As stated above, the resistance value R0 varies between the data "0" cells and the resistance value R1 varies between the data "1" cells. Therefore, when the reference level is generated by referring to the two kinds of reference cells RC0 and RC1 in which complementary data are respectively stored, the reference level varies and becomes uncertain. Such the uncertain reference level increases the probability of erroneous data reading.

3. Second Magnetoresistance Element

Therefore, according to the present exemplary embodiment, a "second magnetoresistance element 100" that is different from the first magnetoresistance element 1 is proposed for use in the reference cell. As will be described later, a resistance value of the second magnetoresistance element 100 is fixed to an intermediate value (hereinafter referred to as "R0.5"; see FIG. 11) between the above-described R0 and R1. That is, the second magnetoresistance element 100 is formed beforehand such that the resistance value thereof is R0.5 independently. By applying such the second magnetoresistance element 100 to the reference cell, the variation in the reference level can be prevented.

3-1. Example (1)

Figure 12A:
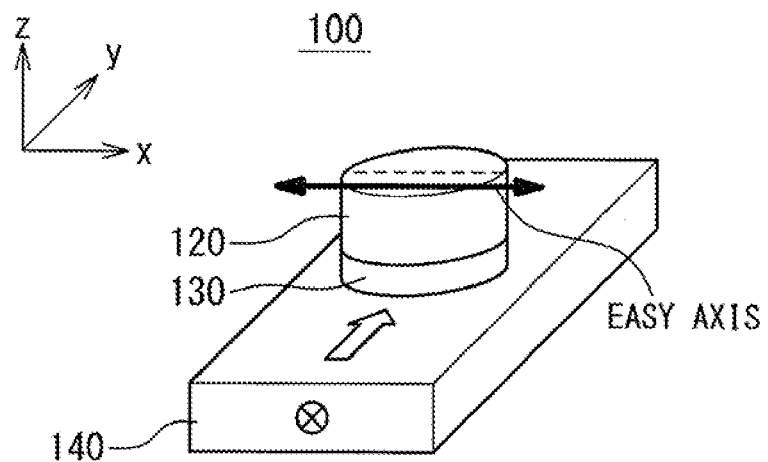
FIG. 12A is a perspective view showing an example of a second magnetoresistance element according to the exemplary embodiment of the present invention.
Figure 12B:
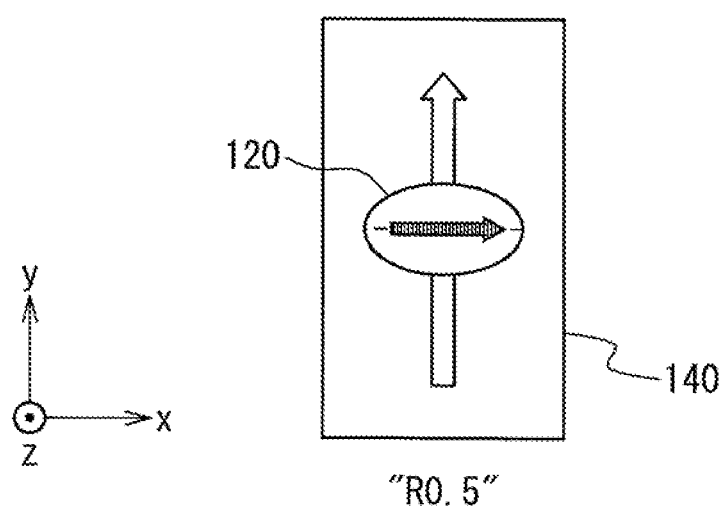
FIG. 12B is a plan view showing magnetization state of the second magnetoresistance element shown in FIG. 12A.

FIG. 12A is a perspective view showing an example of the second magnetoresistance element 100 according to the present exemplary embodiment. FIG. 12B is a plan view showing magnetization state of the second magnetoresistance element 100 shown in FIG. 12A. The second magnetoresistance element 100 according to the present example has a structure similar to that obtained by omitting the write layer (the first magnetization free layer 10) from the first magnetoresistance element 1 shown in the foregoing FIG. 8.

More specifically, the second magnetoresistance element 100 has a third magnetization free layer 120, a second nonmagnetic layer 130 and a second magnetization fixed layer 140. The third magnetization free layer 120 is provided adjacent to one surface of the second nonmagnetic layer 130, and the second magnetization fixed layer 140 is provided adjacent to the other surface of the second nonmagnetic layer 130. That is, the second nonmagnetic layer 130 is sandwiched between the third magnetization free layer 120 and the second magnetization fixed layer 140.

The third magnetization free layer 120 and the second magnetization fixed layer 140 each is a ferromagnetic layer formed of ferromagnetic material. Moreover, the third magnetization free layer 120 and the second magnetization fixed layer 140 each is an in-plane magnetization film having the in-plane magnetic anisotropy. The in-plane magnetization film is formed of ferromagnetic material including at least one material selected from Fe, Co and Ni. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au and the like. Concrete examples of the material include Ni—Fe, Co—Fe, Fe—Co—Ni, Ni—Fe—Zr, Co—Fe—B and Co—Fe—Zr—B. The second nonmagnetic layer 130 is preferably formed of insulating material. Concrete examples of the material include Mg—O, Al—O, Al—N, Ni—O and Hf—O. The third magnetization free layer 120, the second nonmagnetic layer 130 and the second magnetization fixed layer 140 form an MTJ.

In the second magnetoresistance element 100, a magnetization direction of the second magnetization fixed layer 140 is fixed in an in-plane direction. For example, in FIGS. 12A and 12B, the magnetization direction of the second magnetization fixed layer 140 is fixed in the +y-direction. The fixation of the magnetization direction can be achieved by the same manner as in the case of the first magnetoresistance element 1. Whereas, a magnetization easy axis of the third magnetization free layer 120 is perpendicular to the magnetization direction of the second magnetization fixed layer 140. In other words, the magnetization easy axis of the third magnetization free layer 120 is perpendicular to the y-direction and parallel to the x-direction. Particularly, in the example shown in FIG. 12A and FIG. 12B, a planar shape of the third magnetization free layer 120 is ellipse and the long axis of the ellipse is along the x-direction.

The above-described third magnetization free layer 120, second nonmagnetic layer 130 and second magnetization fixed layer 140 constitute a "read layer group". That is, at the time of data reading, the read current is supplied between the third magnetization free layer 120 and the second magnetization fixed layer 140 so as to pass through the MTJ. Meanwhile, the second magnetoresistance element 100 according to the present example is not provided with a structure corresponding to the write layer. In other words, a perpendicular magnetization film that affects magnetization state of the third magnetization free layer 120 of the read layer group is not provided.

Therefore, as shown in FIG. 12B, the magnetization direction of the third magnetization free layer 120 is along the magnetization easy axis direction thereof (the x-axis direction). In the example shown in FIG. 12B, the magnetization direction of the third magnetization free layer 120 is the +x-direction. On the other hand, the magnetization direction of the second magnetization fixed layer 140 is fixed in a direction perpendicular to the magnetization easy axis of the third magnetization free layer 120. Therefore, the resistance value of the read layer group is the above-mentioned intermediate value "R0.5" between R0 and R1. That is, the second magnetoresistance element 100 is formed beforehand such that the MTJ resistance value is "R0.5" independently.

3-2. Example (2)

Figure 13A:
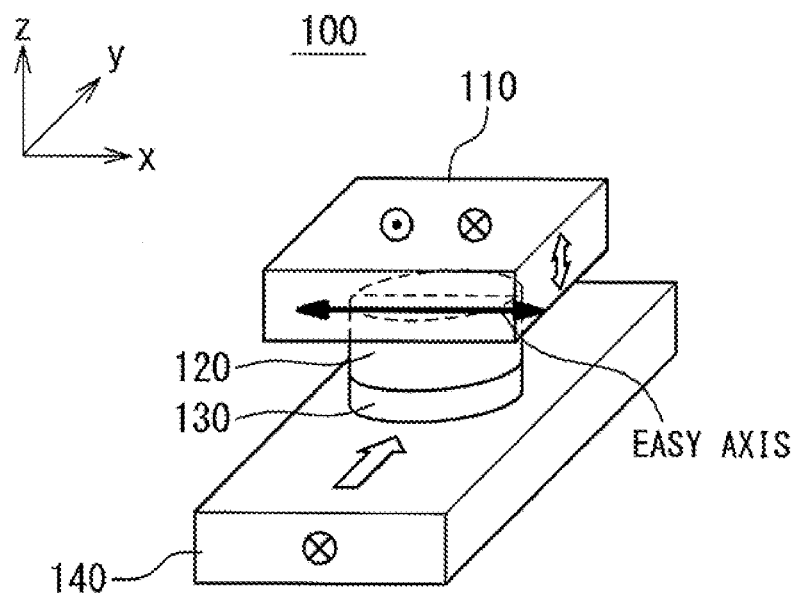
FIG. 13A is a perspective view showing another example of the second magnetoresistance element according to the exemplary embodiment of the present invention.
Figure 13B:
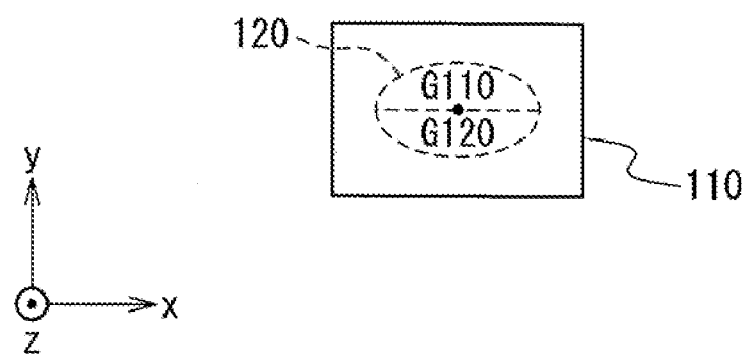
FIG. 13B is a x-y plan view of the structure shown in FIG. 13A.

FIG. 13A is a perspective view showing another example of the second magnetoresistance element 100. FIG. 13B is a x-y plan view of the structure shown in FIG. 13A. The second magnetoresistance element 100 according to the present example has not only the structure shown in FIGS. 12A and 12B but also a structure corresponding to the write layer (the first magnetization free layer 10) of the first magnetoresistance element 1. It should be noted that, although the centers are displaced on purpose in the case of the first magnetoresistance element 1, centers are coincident with each other in the second magnetoresistance element 100 according to the present example. The same reference numerals are given to the same components as those described in FIGS. 12A and 12B, and an overlapping description will be omitted as appropriate.

As shown in FIG. 13A, the second magnetoresistance element 100 further has a fourth magnetization free layer 110 in addition to the read layer group (120 to 140). The fourth magnetization free layer 110 is a ferromagnetic film formed of ferromagnetic material. Moreover, the fourth magnetization free layer 110 is a perpendicular magnetization film having the perpendicular magnetic anisotropy, and magnetization direction thereof is the +z-direction or the −z-direction. Material of the fourth magnetization free layer 110 is the same as that of the first magnetization free layer 10 of the first magnetoresistance element 1.

The fourth magnetization free layer 110 having the perpendicular magnetic anisotropy and the above-mentioned third magnetization free layer 120 having the in-plane magnetic anisotropy in the read layer group are magnetically coupled to each other. However, as shown in FIG. 13B, center G110 of the fourth magnetization free layer 110 and center G120 of the third magnetization free layer 120 are coincident with each other in the x-y plane. Therefore, the perpendicular magnetization of the fourth magnetization free layer 110 does not change the direction of the in-plane magnetization of the third magnetization free layer 120. The magnetization direction of the third magnetization free layer 120 remains parallel to the magnetization easy axis thereof. That is, the read layer group is in the state shown in the foregoing FIG. 12B, and thus the "R0.5" is achieved.

3-3. Example (3)

Figure 14A:
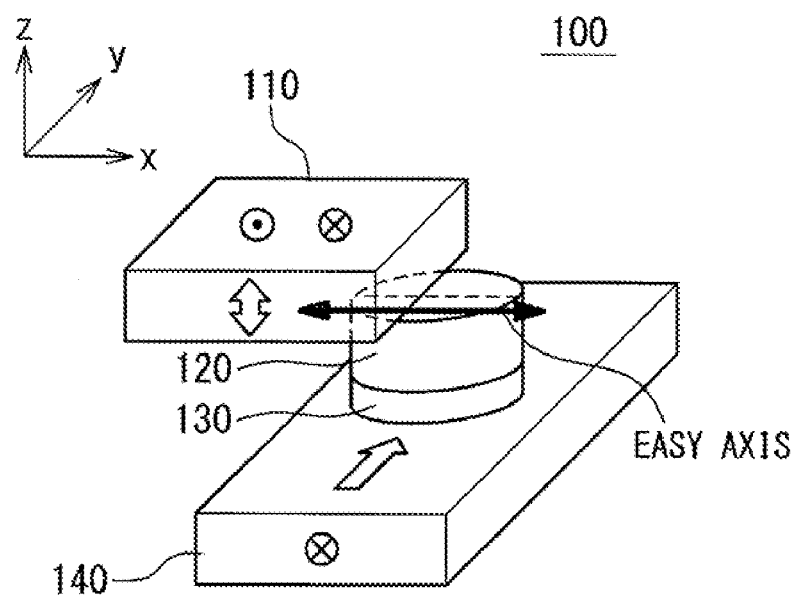
FIG. 14A is a perspective view showing still another example of the second magnetoresistance element according to the exemplary embodiment of the present invention.
Figure 14B:
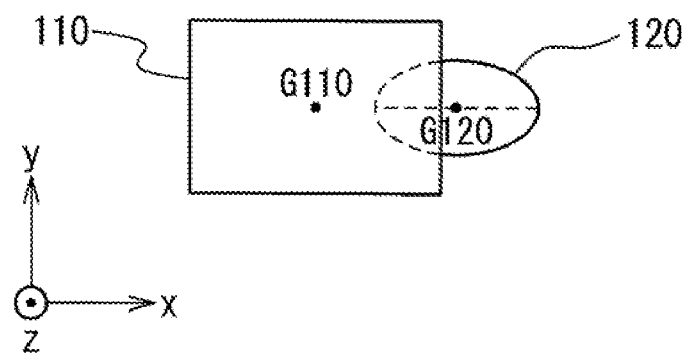
FIG. 14B is a x-y plan view of the structure shown in FIG. 14A.

FIG. 14A is a perspective view showing still another example of the second magnetoresistance element 100. FIG. 14B is a x-y plan view of the structure shown in FIG. 14A. The second magnetoresistance element 100 according to the present example has the same components as those shown in FIGS. 13A and 13B. However, a positional relationship of the centers is different. The same reference numerals are given to the same components as those described in FIGS. 13A and 13B, and an overlapping description will be omitted as appropriate.

According to the present example, the center G110 of the fourth magnetization free layer 110 having the perpendicular magnetic anisotropy is displaced from the center G120 of the third magnetization free layer 120 having the in plane magnetic anisotropy. In the x-y plane, the displacement direction is consistent with the magnetization easy axis direction of the third magnetization free layer 120. For example, as shown in FIG. 14B, the center G110 of the fourth magnetization free layer 110 is displaced in the −x-direction from the center G120 of the third magnetization free layer 120. The displacement direction is parallel to the magnetization easy axis direction (x-axis direction) of the third magnetization free layer 120 and perpendicular to the magnetization direction of the second magnetization fixed layer 140.

In this case, the perpendicular magnetization of the fourth magnetization free layer 110 applies a magnetization component in the +x-direction or in the −x-direction to the third magnetization free layer 120. Since the magnetization component is consistent with the magnetization easy axis direction, the in-plane magnetization of the third magnetization free layer 120 does not rotate. The magnetization direction of the third magnetization free layer 120 remains parallel to the magnetization easy axis thereof. That is, the read layer group is in the state shown in the foregoing FIG. 12B, and thus the "R0.5" is achieved.

4. MRAM

Figure 15:
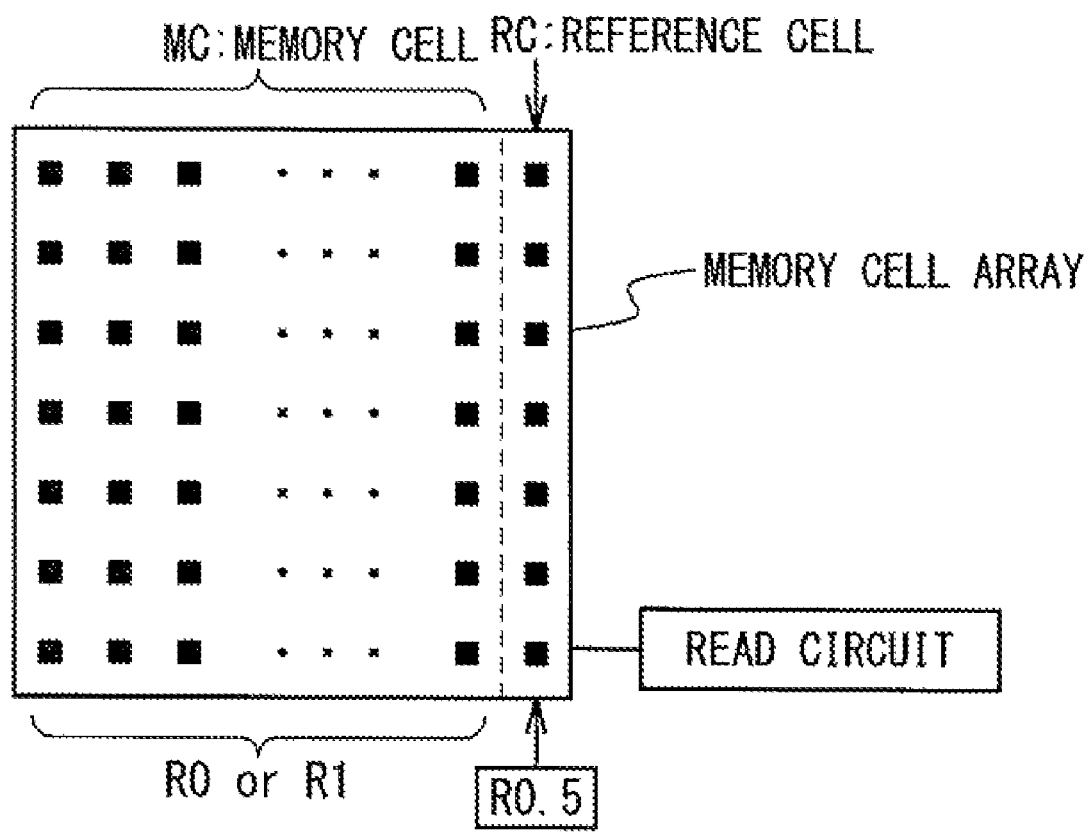
FIG. 15 is a schematic view showing a configuration of an MRAM according to the exemplary embodiment of the present invention.

FIG. 15 schematically shows a configuration of an MRAM according to the exemplary embodiment of the present invention. A memory cell array of the MRAM has a plurality of cells that are arranged in a matrix form. More specifically, the cells include a memory cell MC used for storing data and a reference cell RC that is referred to for generating a reference level at the time of data reading. According to the present invention, the first magnetoresistance element 1 is applied to the memory cell MC. On the other hand, the second magnetoresistance element 100 is applied to the reference cell RC.

From a viewpoint of manufacturing process, it is preferable that respective layers of the first magnetoresistance element 1 and respective layers of the second magnetoresistance element 100 are formed in the same layers. For example, in a case where the second magnetoresistance element 100 shown in FIG. 12A is used, the third magnetization free layer 120, the second nonmagnetic layer 130 and the second magnetization fixed layer 140 are respectively formed in the same layers as the second magnetization free layer 20, the first nonmagnetic layer 30 and the first magnetization fixed layer 40 of the first magnetoresistance element 1. In a case where the second magnetoresistance element 100 shown in FIG. 13A or 14A is used, the fourth magnetization free layer 110 also is formed in the same layer as the first magnetization free layer 10 of the first magnetoresistance element 1.

The first magnetoresistance element 1 included in the memory cell MC can be any of the foregoing examples (refer to FIGS. 1A to 6B, 8 and 9). The resistance value of the read layer group (20 to 40) of the first magnetoresistance element 1 is switched between R0 and R1 depending on the memory data. The second magnetoresistance element 100 included in the reference cell RC can be any of the foregoing examples (refer to FIGS. 12A to 14B). The resistance value of the read layer group (120 to 140) of the second magnetoresistance element 100 is fixed to the intermediate value "R0.5".

At the time of data reading, the read current is supplied to a read-target memory cell MC and the reference cell RC. Based on the read current flowing in the memory cell MC, a read circuit generates a read-out level depending on the memory data (R0 or R1) of the memory cell MC. Moreover, based on the read current flowing in the reference cell RC, the read circuit generates a reference level corresponding to the intermediate resistance value R0.5. Then, the read circuit compares the read-out level with the reference level to determine the memory data (R0 or R1) of the memory cell MC.

Figure 16:
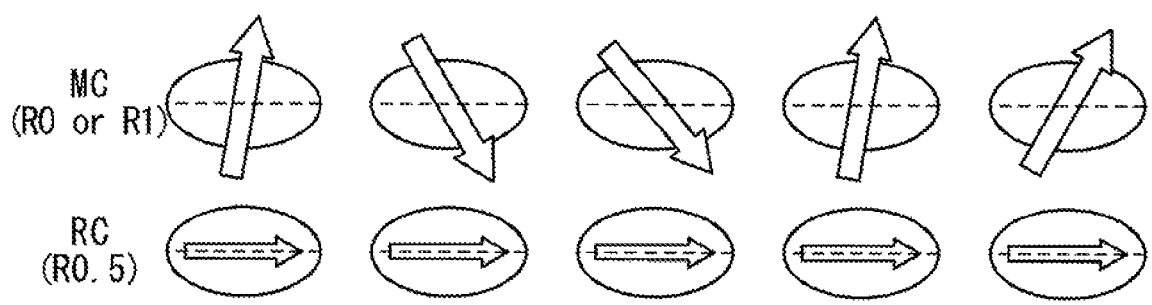
FIG. 16 is a conceptual diagram showing magnetization state of a memory cell and a reference cell according to the exemplary embodiment of the present invention.

FIG. 16 shows an example of the magnetization states of the second magnetization free layer 20 of the memory cell MC and the third magnetization free layer 120 of the reference cell RC. Here, the first magnetoresistance element 1 shown in FIGS. 8 and 9 is applied to the memory cell MC. That is, the magnetization of the second magnetization free layer 20 rotates from the magnetization easy axis as a center. The magnetization rotation amount (resistance value R0) varies between the memory cells MC of the data "0", and the magnetization rotation amount (resistance value R1) varies between the memory cells MC of the data "1" (see also FIG. 10). On the other hand, in the reference cell RC, the magnetization direction of the third magnetization free layer 120 is completely along the magnetization easy axis. Therefore, even when the magnetization rotation amount is varied in the memory cells MC, it is possible to correctly determine the magnetization rotation direction, namely the memory data (R0 or R1).

The description above can be generalized as follows. Regarding the memory cell MC, the resistance value R0 may vary between the data "0" cells and the resistance value R1 may vary between the data "1" cells. However, according to the present exemplary embodiment, the reference cell RC is certainly set to the "R0.5", and thus variation in the resistance value is hardly caused at least with regard to the reference cell RC. This means that variation in the reference level is suppressed and a more correct reference level can be obtained. By using the correct reference level (R0.5), it is possible to correctly determine the memory data (R0 or R1) of the memory cell MC (refer to FIG. 11).

As described above, according to the present exemplary embodiment, the variation in the reference level can be suppressed by applying the second magnetoresistance element 100 to the reference cell RC. As a result, erroneous data reading can be suppressed. The first magnetoresistance element 1 applied to the memory cell MC can be any of the foregoing examples. What is important is that the variation in the magnetization state can be suppressed in the reference cells RC.

Moreover, according to the present exemplary embodiment, the second magnetoresistance element 100 whose resistance value is R0.5 independently is used. Therefore, there is no need to prepare the two kinds of reference cells RC0 and RC1 (refer to FIG. 7) in which complementary data (R0, R1) are respectively stored. A single kind of reference cell RC (refer to FIG. 15) having the second magnetoresistance element 100 is sufficient.

In the case of FIG. 7, it is necessary to initially set the complementary data in the respective reference cells RC0 and RC1 by using the set controller. According to the present exemplary embodiment, on the other hand, the reference cell RC is so formed beforehand as to have the resistance value of R0.5, and thus no initial setting process is required for the reference cell RC. Therefore, a manufacturing time is shortened and manufacturing costs are reduced. Moreover, since there is no need to provide the controller for use in the initial setting, an area of the MRAM can be reduced.

Moreover, in the case of FIG. 7, the read circuit needs to refer to the two kinds of the reference cells RC0 and RC1 to calculate the reference level corresponding to the intermediate resistance value of the resistance values R0 and R1. In the case of FIG. 15, on the other hand, the reference level can be obtained directly by referring to the single kind of the reference cell RC whose resistance value is fixed to the R0.5. Therefore, a circuit configuration is simplified and thus the area of the MRAM can be reduced.

Furthermore, in the case of FIG. 7, two columns are required for placing the two kinds of the reference cells RC0 and RC1. In the case of FIG. 15, on the other hand, one column is sufficient for placing the single kind of the reference cell RC. Since a region for the reference cells is made unnecessary by one column, the area of the memory cell array can be reduced. In particular, the area reduction effect becomes remarkable in a case of a small-scale array.

While the exemplary embodiments of the present invention have been described above with reference to the attached drawings, the present invention is not limited to these exemplary embodiments and can be modified as appropriate by those skilled in the art without departing from the spirit and scope of the present invention.

This application is the National Phase of PCT/JP2009/050210, filed Jan. 9, 2009, which is based upon and claims the benefit of priority from Japanese patent application No. 2008-038066, filed on Feb. 19, 2008, the disclosure of which is incorporated herein in its entirely by reference.

The invention claimed is:

1. A magnetic random access memory comprising:
a memory cell including a first magnetoresistance element; and
a reference cell including a second magnetoresistance element, which is referred to for generating a reference level at a time of data reading from said memory cell,
wherein said first magnetoresistance element comprises:
a first magnetization free layer having perpendicular magnetic anisotropy;
a first magnetization fixed layer having in-plane magnetic anisotropy and whose magnetization direction is fixed;
a second magnetization free layer having in-plane magnetic anisotropy and whose magnetization direction is variable; and
a first nonmagnetic layer sandwiched between said first magnetization fixed layer and said second magnetization free layer,
wherein said first magnetization free layer comprises:
a first magnetization fixed region whose magnetization direction is fixed;
a second magnetization fixed region whose magnetization direction is fixed; and
a magnetization free region whose magnetization direction is reversible and that is connected to said first magnetization fixed region and said second magnetization fixed region,
wherein said magnetization free region and said second magnetization free layer are magnetically coupled to each other, and
center of said second magnetization free layer is displaced in a first direction from center of said magnetization free region in a first plane parallel to each layer,
wherein said second magnetoresistance element comprises:
a third magnetization free layer whose magnetization easy axis is parallel to a second direction;
a second magnetization fixed layer whose magnetization direction is fixed in a third direction perpendicular to said second direction; and
a second nonmagnetic layer sandwiched between said second magnetization fixed layer and said third magnetization free layer,
wherein said second magnetization fixed layer and said third magnetization free layer have in-plane magnetic anisotropy.

2. The magnetic random access memory according to claim 1,
wherein a magnetization easy axis of said second magnetization free layer is perpendicular to said first direction, and
the magnetization direction of said first magnetization fixed layer is parallel to or anti-parallel to said first direction.

3. The magnetic random access memory according to claim 1,
wherein a long axis direction of a planar shape of said third magnetization free layer is said second direction.

4. The magnetic random access memory according to claim 1,
wherein said second magnetization free layer and said third magnetization free layer are formed in a same layer,
said first magnetization fixed layer and said second magnetization fixed layer are formed in a same layer, and
said first nonmagnetic layer and said second nonmagnetic layer are formed in a same layer.

5. The magnetic random access memory according to claim 1,
wherein said second magnetoresistance element further comprises: a fourth magnetization free layer having perpendicular magnetic anisotropy,
wherein said third magnetization free layer and said fourth magnetization free layer are magnetically coupled to each other, and
a magnetization direction of said third magnetization free layer is parallel to said second direction.

6. The magnetic random access memory according to claim 5,
wherein in said first plane, center of said third magnetization free layer is coincident with center of said fourth magnetization free layer.

7. The magnetic random access memory according to claim 5,
wherein in said first plane, center of said third magnetization free layer is displaced in said second direction from center of said fourth magnetization free layer.

8. The magnetic random access memory according to claim 5,
wherein said first magnetization free layer and said fourth magnetization free layer are formed in a same layer,
said second magnetization free layer and said third magnetization free layer are formed in a same layer,
said first magnetization fixed layer and said second magnetization fixed layer are formed in a same layer, and
said first nonmagnetic layer and said second nonmagnetic layer are formed in a same layer.

9. The magnetic random access memory according to claim 1,
wherein said first magnetization fixed region is disposed adjacent to one end of said magnetization free region, and
said second magnetization fixed region is disposed adjacent to the other end of said magnetization free region.

10. The magnetic random access memory according to claim 1,
wherein said first magnetization fixed region is disposed adjacent to one end of said magnetization free region,
said second magnetization fixed region is disposed adjacent to said one end of said magnetization free region, and
said first magnetization fixed region, said second magnetization fixed region and said magnetization free region form a three-way intersection.

* * * * *